US008198540B2

(12) United States Patent
Kuromitsu et al.

(10) Patent No.: US 8,198,540 B2
(45) Date of Patent: Jun. 12, 2012

(54) POWER ELEMENT MOUNTING SUBSTRATE, METHOD OF MANUFACTURING THE SAME, POWER ELEMENT MOUNTING UNIT, METHOD OF MANUFACTURING THE SAME, AND POWER MODULE

(75) Inventors: Yoshirou Kuromitsu, Saitama (JP); Hiroya Ishizuka, Koshigaya (JP); Hiroshi Miyata, Kitamoto (JP); Takeshi Kitahara, Toyota (JP); Hiroshi Tonomura, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 608 days.

(21) Appl. No.: 12/303,513

(22) PCT Filed: Jun. 6, 2007

(86) PCT No.: PCT/JP2007/061446
§ 371 (c)(1),
(2), (4) Date: Dec. 4, 2008

(87) PCT Pub. No.: WO2007/142261
PCT Pub. Date: Dec. 13, 2007

(65) Prior Publication Data
US 2009/0145642 A1 Jun. 11, 2009

(30) Foreign Application Priority Data

| Jun. 6, 2006 | (JP) | 2006-157124 |
| Jun. 6, 2006 | (JP) | 2006-157125 |
| Jun. 20, 2006 | (JP) | 2006-169838 |
| Jul. 12, 2006 | (JP) | 2006-191468 |
| Aug. 21, 2006 | (JP) | 2006-224112 |
| Mar. 12, 2007 | (JP) | 2007-061640 |

(51) Int. Cl.
*H05K 1/00* (2006.01)
*H05K 7/20* (2006.01)
(52) U.S. Cl. ........ 174/252; 174/260; 361/699; 361/702; 361/704; 361/719; 165/185
(58) Field of Classification Search .................. 174/250, 174/252, 257; 361/679.53–679.54, 699, 361/701, 704, 719–720; 165/104.33, 185
See application file for complete search history.

(56) References Cited

U.S. PATENT DOCUMENTS
3,876,479 A * 4/1975 Yamada .......................... 216/35
(Continued)

FOREIGN PATENT DOCUMENTS
JP 04-363052 A 12/1992
(Continued)

OTHER PUBLICATIONS
Japanese Office Action mailed Nov. 1, 2011 for the corresponding Japanese Application No. 2006-191468.
(Continued)

*Primary Examiner* — Robert J Hoffberg
(74) *Attorney, Agent, or Firm* — Leason Ellis LLP

(57) ABSTRACT

A power element mounting substrate including a circuit layer brazed to a surface of a ceramic plate, and a power element soldered to a front surface of the circuit layer, wherein the circuit layer is constituted using an Al alloy with an average purity of more than or equal to 98.0 wt % and less than or equal to 99.9 wt %, Fe concentration of the circuit layer at a side of a surface to be brazed to the ceramic plate is less than 0.1 wt %, and Fe concentration of the circuit layer at a side of the surface opposite to the surface to be brazed is more than or equal to 0.1 wt %.

15 Claims, 10 Drawing Sheets

U.S. PATENT DOCUMENTS

| | | | |
|---|---|---|---|
| 4,750,262 A * | 6/1988 | Mahmoud et al. | 29/832 |
| 5,518,070 A * | 5/1996 | Kato | 165/180 |
| 6,912,130 B2 | 6/2005 | Osanai et al. | |
| 7,128,979 B2 * | 10/2006 | Nagase et al. | 428/545 |
| 8,044,500 B2 * | 10/2011 | Kitahara et al. | 257/691 |
| 2002/0060091 A1 | 5/2002 | Naba et al. | |
| 2005/0214518 A1 | 9/2005 | Nagase et al. | |
| 2006/0088726 A1* | 4/2006 | Sucke | 428/654 |
| 2007/0274047 A1* | 11/2007 | Nagase et al. | 361/704 |
| 2009/0229864 A1* | 9/2009 | Kuromitsu et al. | 174/252 |
| 2009/0267215 A1* | 10/2009 | Kitahara et al. | 257/691 |

FOREIGN PATENT DOCUMENTS

| | | |
|---|---|---|
| JP | 06-163764 A | 6/1994 |
| JP | 3044952 B2 | 3/2000 |
| JP | 2001-313358 A | 11/2001 |
| JP | 2002-171037 A | 6/2002 |
| JP | A-2003-086747 | 3/2003 |
| JP | 2004-115337 A1 | 4/2004 |
| JP | 2007013028 A * | 1/2007 |
| WO | WO-03/090277 A1 | 10/2003 |

OTHER PUBLICATIONS

Japanese Notice of Allowance mailed Nov. 1, 2011 for the corresponding Japanese Application No. 2006-157125.

* cited by examiner

POWER ELEMENT MOUNTING SUBSTRATE, METHOD OF MANUFACTURING THE SAME, POWER ELEMENT MOUNTING UNIT, METHOD OF MANUFACTURING THE SAME, AND POWER MODULE

CROSS-REFERENCE TO PRIOR APPLICATION

This is the U.S. National Phase Application under 35 U.S.C. §371 of International Patent Application No. PCT/JP2007/061446 filed Jun. 6, 2007, which claims the benefit of Japanese Patent Application Nos. 2006-157124 filed Jun. 6, 2006, 2006-157125 filed Jun. 6, 2006, 2006-169838 filed Jun. 20, 2006, 2006-191468 filed Jul. 12, 2006, 2006-224112 filed Aug. 21, 2006 and 2007-061640 filed Mar. 12, 2007, all of which are incorporated by reference herein. The International Application was published in Japanese on Dec. 13, 2007 as WO2007/142261 A1 under PCT Article 21(2).

BACKGROUND OF THE INVENTION

1. Field of the Invention

The present invention relates to a power element mounting substrate, a method of manufacturing the same, a power element mounting unit, a method of manufacturing the same, and a power module, which are used in a semiconductor device for controlling high current and high voltage.

2. Background Art

As shown in the below-listed Patent Document 1, such a power module generally includes a power element mounting substrate and a power element. The power element mounting substrate includes a circuit layer brazed on a surface of a ceramic plate. The power element is soldered to a front surface of the circuit layer. The circuit layer and the power element are conventionally soldered using a PbSn-containing solder material. Recently, however, so-called lead-free solder materials which contain no Pb are used widely from the environmental point of view.

As shown in the below-listed Patent Documents 2 and 3, in order to reduce total thermal resistance in a stacking direction, such a power module recently includes a power element mounting unit. In the power element mounting unit, a circuit layer is brazed to a front surface of a ceramic plate, and a cooler having a cooling channel formed therein is brazed to a back surface of the ceramic plate. The total thermal resistance of the power module is reduced by the structure in which the cooler is brazed directly to the back surface of the ceramic plate with no other member disposed therebetween.

As shown in the below-listed Patent Document 2, in order to reduce total thermal resistance in a stacking direction, some power modules recently include a power element mounting unit with a circuit layer brazed to a front surface of a ceramic plate, and a cooler brazed to a back surface of the ceramic plate. The total thermal resistance of the power module is reduced by the structure in which the cooler is brazed directly to the back surface of the ceramic plate with no other member disposed therebetween.

In this case, the cooler is constituted using an Al alloy and includes a top plate section having a surface to be brazed to the ceramic plate, and a pending section provided to suspend from a surface opposite to the surface to be brazed.

The cooler may include, other than the top plate section and the pending section, a bottom plate section provided in parallel with the top plate section and connected to the pending section. The cooler may include a refrigerant supply channel surrounded by the top plate section, the pending section and the bottom plate section. Alternatively, the cooler may include no bottom plate section, and include the top plate section and the pending section. Plural pending sections used as pins or fins may be provided on a surface opposite to the surface to be brazed in the top plate section.

As shown in the below-listed Patent Document 4, a known power module includes a power element mounting substrate and a power element. The power element mounting substrate includes a circuit layer brazed to a front surface of a ceramic plate, and a heat block which is constituted using a pure Cu or Cu alloy and is soldered to a front surface of the circuit layer. The power element is soldered to a surface of the heat block. With the heat block, heat conducted from the power element to the heat block via the solder layer is immediately distributed in a surface direction of the heat block so as to prevent temperature rise in the power element.

Patent Document 1: WO 03/090277
Patent Document 2: Japanese Unexamined Patent Application, First Publication No. H4-363052
Patent Document 3: Japanese Unexamined Patent Application, First Publication No. 2004-115337
Patent Document 4: Japanese Patent No. 3044952

SUMMARY OF THE INVENTION

Such a lead-free solder material has a yield stress and Young's modulus which are higher than those of a PbSn-containing solder material. A crack may easily develop in a solder layer between the circuit layer and the power element when the power module is subject to a heat cycle.

An object of the invention is to provide a power element mounting substrate, a method of manufacturing the same and a power module, in which easy development of a crack occurring in the solder layer during a heat cycle can be prevented even if a lead-free solder material is used for soldering the circuit layer and the power element.

In the conventional power element mounting unit, difference in flexural rigidity of the circuit layer and the cooler is large and thus warping easily occurs during brazing if the cooler is directly brazed to the back surface of the ceramic plate. Then, reliability on the heat cycle may decrease, e.g., in that a crack may develop easily in the solder layer which joins the circuit layer and the power element when the power module is subject to a heat cycle.

Another object of the invention is to provide a power element mounting unit, a method of manufacturing the same and a power module, in which the occurrence of warping during brazing can be prevented to control a decrease in reliability on the heat cycle even if the cooler is brazed directly to a back surface of a ceramic plate.

It is recently required to increase the reliability of the heat cycle by, for example, preventing detachment in a joining interface of a cooler and a ceramic plate when the power module is subject to a heat cycle. To address the need, it has been considered to form the entire cooler with high purity Al alloy or pure Al. Even if stress is caused at the joining interface of the ceramic plate and the cooler during the heat cycle due to differences in their thermal expansion coefficients, the side of the surface to be brazed of the circuit layer undergoes plastic deformation to absorb the stress. Thus, detachment in the joining interface can be prevented.

High purity Al alloy or pure Al has, however, lower flexural rigidity as compared with that of low purity Al alloy. Accordingly, since a stacked member is produced by brazing material foil and a cooler disposed on a back surface of a ceramic plate in this order and the stacked member is pressed in the stacking direction to braze the ceramic plate and the cooler, a pending section of the cooler may become buckled. The cooler becomes thinner to address the recent need for reducing the weight of the power module. However, buckling is caused more easily in a thin cooler.

A further object of the invention is to provide a power element mounting unit, a method of manufacturing the same and a power module, in which the reliability of the heat cycle of the power module can be increased without imparting buckling strength of the pending section of the cooler.

In the conventional power element mounting unit, the difference in flexural rigidity of the circuit layer and the cooler is large and thus warping easily occurs during brazing if the cooler is directly brazed to the back surface of the ceramic plate. Thus reliability of the heat cycle may decrease. As a result, for example, a crack may develop easily in the solder layer which joins the circuit layer and the power element when the power module is subject to a heat cycle.

A further object of the invention is to provide a power element mounting unit and a power module in which generation of warping during brazing can be avoided, and decrease in reliability of the heat cycle can be avoided even if the cooler is brazed directly to a back surface of a ceramic plate.

Recently, it is required to control detachment in the joining interface of the ceramic plate and the circuit layer when the power module is subject to a heat cycle or to control development of a crack caused in the solder layer which joins the circuit layer and the heat block. Increase in joining reliability when the power module is subject to a heat cycle is required.

A further object of the invention is to provide a power element mounting substrate, a method of manufacturing the same and a power module, in which joining reliability of the power module can be increased when the power module is subject to a heat cycle.

An aspect of the invention is a power element mounting substrate including a circuit layer brazed to a surface of a ceramic plate and a power element soldered to a front surface of the circuit layer, wherein the circuit layer constituted using an Al alloy with an average purity of more than or equal to 98.0 wt % and less than or equal to 99.9 wt %, Fe concentration of the circuit layer at a side of a surface to be brazed to the ceramic plate is less than 0.1 wt %, and Fe concentration of the circuit layer at a side of a surface opposite to the surface to be brazed is more than or equal to 0.1 wt %.

According to the power element mounting substrate, since the Fe concentration in the side of the opposite surface of the circuit layer is more than or equal to 0.1 wt %, the side of the opposite surface can be cured gradually with repeated thermal deformation of the circuit layer during the heat cycle and plastic deformation which occurs in the side of the opposite surface can be reduced. As a result, load acting on a solder layer which joins the opposite surface of the circuit layer and the power element due to plastic deformation of the circuit layer during the heat cycle can be reduced. Even if a crack is caused in the solder layer during the heat cycle, development of the crack can be prevented. Even if a lead-free solder material is used to solder the circuit layer and the power element, easy development of the crack in the solder layer during the heat cycle can be prevented.

Since the Fe concentration in the surface to be brazed of the circuit layer is less than 0.1 wt %, even if stress is caused at a joining interface of the ceramic plate and the circuit layer during the heat cycle due to differences in their thermal expansion coefficients, the surface to be brazed of the circuit layer undergoes plastic deformation to absorb the stress. Thus, the stress acting on the joining interface can be reduced and joining reliability of the ceramic plate and the circuit layer can be increased.

The side of the surface to be brazed of the circuit layer may be defined as a section of more than or equal to 10% to less than or equal to 50% of the thickness of the circuit layer from the surface to be brazed toward the opposite surface and the remainder may be defined as the side of the opposite surface.

With this configuration, the aforementioned operation effect is achieved more reliably.

Another aspect of the invention is a method of manufacturing a power element mounting substrate with a circuit layer brazed to a surface of a ceramic plate and a power element soldered to a front surface of the circuit layer, the method including: producing a stacked member by placing, on a front surface of the ceramic plate, Al-containing brazing material foil and a circuit layer material constituted using an Al alloy with Fe concentration of more than or equal to 0.05 wt % to less than or equal to 1.0 wt % and purity of more than or equal to 98.5 wt % to less than or equal to 99.95 wt % in this order; and producing the power element mounting substrate by heating the stacked member while the stacked member is pressed in a stacking direction to melt the brazing material foil, and brazing the circuit layer material to the front surface of the ceramic plate.

In the aspect of the invention, the stacked member is brazed while the stacked member is pressed in the stacking direction. The front surface of the ceramic plate and the circuit layer material can be successfully brazed together. Fe contained in the side of the surface of the circuit layer material to be brazed to the ceramic plate can be successfully dissolved into the brazing material which has melted in the joining interface. Accordingly, a power element mounting substrate having Fe concentration of less than 0.1 wt % in the side of the surface to be brazed of the circuit layer and more than or equal to 0.1 wt % in the side of the surface opposite to the surface to be brazed can be reliably produced.

A further aspect of the invention is a power module including a power element mounting substrate with a circuit layer brazed to a surface of a ceramic plate, and a power element soldered to a front surface of the circuit layer, wherein the power element mounting substrate is the power element mounting substrate according to the aforementioned aspects.

A further aspect of the invention is a power element mounting unit with a circuit layer brazed to a surface of a ceramic plate and a cooler having a cooling channel formed therein brazed to a back surface of the ceramic plate, wherein the circuit layer constituted using an Al alloy with an average purity of more than or equal to 98.0 wt % and less than or equal to 99.9 wt %, Fe concentration of the circuit layer at a side of a surface to be brazed to the ceramic plate is less than 0.1 wt %, and Fe concentration of the circuit layer at a side of the surface opposite to the surface to be brazed is more than or equal to 0.1 wt %.

According to the power element mounting unit of the aspect of the invention, since the Fe concentration in the side of the opposite surface of the circuit layer is more than or equal to 0.1 wt %, flexural rigidity of the entire circuit layer can be increased to reduce the difference between flexural rigidity of the cooler. Thus, the amount of warping caused during brazing to produce the power element mounting unit can be reduced. As a result, decrease in reliability of the heat cycle can be prevented, and thus, for example, occurrence of easy development of the crack in the ceramic plate can be prevented.

Since the Fe concentration in the side of the surface to be brazed of the circuit layer is less than 0.1 wt %, even if stress is caused at the joining interface of the ceramic plate and the circuit layer during the heat cycle due to differences in their thermal expansion coefficients, the side of the surface to be brazed of the circuit layer undergoes plastic deformation to absorb the stress. Thus, the stress acting on the joining interface can be reduced and thus joining reliability of the ceramic plate and the circuit layer can be increased.

The Fe concentration in the surface to be brazed is preferably less than or equal to 0.05 wt % from the viewpoint of detachment development ratio at the interface of the ceramic plate and the circuit layer.

The side of the surface to be brazed of the circuit layer may be defined as a section of more than or equal to 10% to less than or equal to 50% of the thickness of the circuit layer from the surface to be brazed toward the opposite surface and the remainder may be defined as the side of the opposite surface.

With this configuration, the aforementioned operation effect is achieved more reliably.

A further aspect of the invention is a method of manufacturing a power element mounting unit with a circuit layer brazed to a surface of a ceramic plate and a cooler having a cooling channel formed therein brazed to a back surface of the ceramic plate, the method including: producing a stacked member by placing, on a front surface of the ceramic plate, Al-containing brazing material foil and a circuit layer material constituted using an Al alloy with Fe concentration of more than or equal to 0.05 wt % to less than or equal to 1.0 wt % and purity of more than or equal to 98.5 wt % to less than or equal to 99.95 wt % in this order; and producing the power element mounting substrate by heating the stacked member while the stacked member is pressed in a stacking direction to melt the brazing material foil, and brazing the circuit layer material to the front surface of the ceramic plate.

In the method of manufacturing the power element mounting unit, the stacked member is brazed while the stacked member is pressed in the stacking direction. The front surface of the ceramic plate and the circuit layer material can be successfully brazed together and Fe contained in the side of the surface of the circuit layer material to be brazed to the ceramic plate can be successfully dissolved into the brazing material which has melted in the joining interface. Accordingly, a power element mounting substrate having Fe concentration of less than 0.1 wt % in the side of the surface to be brazed of the circuit layer and more than or equal to 0.1 wt % in the side of the surface opposite to the surface to be brazed can be reliably produced.

A further aspect of the invention is a power module including a power element mounting unit with a circuit layer brazed to a surface of a ceramic plate and a cooler having a cooling channel formed therein brazed to a back surface of the ceramic plate, and a power element soldered to a front surface of the circuit layer, wherein the power element mounting unit is the power element mounting unit according to the aforementioned aspects.

A further aspect of the invention is a power element mounting unit with a circuit layer brazed to a surface of a ceramic plate and a cooler having a cooling channel formed therein brazed to a back surface of the ceramic plate, wherein the cooler includes a top plate section which has a surface to be brazed to the ceramic plate and a pending section provided to suspend from a surface opposite to the surface to be brazed in the top plate section, the cooler being constituted using an Al alloy with an average purity of more than or equal to 98.0 wt % to less than or equal to 99.9 wt %, and Fe concentration in a surface section of the top plate section is less than 0.1 wt % and Fe concentration in the cooler except for the surface section is more than or equal to 0.1 wt %.

According to this power element mounting unit, since the Fe concentration in the surface section in the side of the surface to be brazed of the top plate section is less than 0.1 wt %, even if stress is caused at the joining interface of the ceramic plate and the cooler during the heat cycle due to differences in their thermal expansion coefficients, the surface section undergoes plastic deformation to absorb the stress. Thus, the stress acting on the joining interface can be reduced and joining reliability of the ceramic plate and the cooler can be increased.

Since the Fe concentration in the cooler except for the surface section is less than 0.1 wt %, the flexural rigidity of the cooler except for the surface section can be maintained at the current level. Accordingly, a stacked member is produced by brazing material foil and a cooler disposed on a back surface of a ceramic plate in this order and the stacked member is pressed in the stacking direction to braze the ceramic plate and the cooler. Here, buckling of the pending section of the cooler can be prevented even if the cooler is thin.

Thus, reliability on the heat cycle of the power module can be increased without impairing the buckling strength of the pending section of the cooler.

The Fe concentration in the surface section is preferably less than or equal to 0.05 wt % from the viewpoint of detachment development ratio at the interface of the ceramic plate and the cooler.

The cooler may include, other than the top plate section and the pending section, a bottom plate section provided in parallel with the top plate section and connected to the pending section. The cooler may include a refrigerant supply channel surrounded by the top plate section, the pending section and the bottom plate section. Alternatively, the cooler may include no bottom plate section, and include the top plate section and the pending section. Plural pending sections used as pins or fins may be provided on a surface opposite to the surface to be brazed in the top plate section.

A further aspect of the invention is a method of manufacturing a power element mounting unit with a circuit layer brazed to a front surface of a ceramic plate and a cooler brazed to a back surface of the ceramic plate, the method including: producing a stacked member by placing a brazing material foil and a cooler on the back surface of the ceramic plate in this order; heating the stacked member while the stacked member is pressed in a stacking direction to melt the brazing material foil; and brazing the cooler on the back surface of the ceramic plate to provide the power element mounting unit according to the aforementioned aspects.

A further aspect of the invention is a power module including a power element mounting unit with a circuit layer brazed to a front surface of a ceramic plate and a cooler brazed to a back surface of the ceramic plate and a power element soldered to a front surface of the circuit layer, wherein the power element mounting unit is the power element mounting unit according to the aforementioned aspects.

A further aspect of the invention is a power element mounting unit with a circuit layer brazed to a surface of a ceramic plate and a cooler constituted using an the same material as that of the circuit layer brazed to a back surface of the ceramic layer, wherein: assuming the thickness of the circuit layer be A3, the thickness of the ceramic plate be B3 and the thickness of a top plate section having a surface to be brazed to the ceramic plate be C3, $0.75 \cdot B3 < C3 < 1.5 \cdot A3 < 3 \cdot B3$ is satisfied.

According to the power element mounting unit, assuming the thickness of the circuit layer be A3, the thickness of the ceramic plate be B3 and the thickness of the top plate section of the cooler be C3, $C3 < 1.5 \cdot A3$ is satisfied. Thus, differences in flexural rigidity of the cooler and flexural rigidity of the circuit layer can be decreased and an amount of warping occurring at the time of forming the power element mounting unit can be reduced. And thus development of a crack in the solder layer which joins the power element to a front surface of the circuit layer in power module can be prevented.

Since $1.5 \cdot A3 < 3 \cdot B3$ is satisfied, elastic deformation of the power module along the surface direction of the front surface of the circuit layer during the heat cycle can be avoided by the ceramic plate. Even if a crack is caused in the solder layer, development of the crack can be prevented. Since $0.75 \cdot B3 < C3$ is satisfied, easy deformation of the top plate section of the cooler caused from decreased differences in flexural rigidity of the cooler and flexural rigidity of the circuit layer can be prevented. Thus, the power element mounting unit cannot become unusable.

A further aspect of the invention is a power module including a power element mounting unit with a circuit layer brazed to a surface of a ceramic plate and a cooler constituted using an the same material as that of the circuit layer brazed to a back surface of the ceramic layer, and a power element soldered to a front surface of the circuit layer, wherein the power element mounting unit is the power element mounting unit according to the aforementioned aspects.

A further aspect of the invention is a power element mounting substrate with a circuit layer brazed to a surface of a ceramic plate, a heat block constituted using an pure Cu or Cu alloy soldered to a front surface of the circuit layer, and a power element soldered to a surface of the heat block, wherein the circuit layer is constituted using an Al alloy with an average purity of more than or equal to 98.0 wt % and less than or equal to 99.9 wt %, Fe concentration at the side of the front surface of the circuit layer to which the heat block is soldered is more than or equal to 0.1 wt %, and Fe concentration at the side of the back surface of the circuit layer to which the ceramic plate is brazed is less than 0.1 wt %.

According to the power element mounting substrate, since the Fe concentration in the side of the back surface of the circuit layer is less than 0.1 wt %, even if stress is caused at the joining interface of the ceramic plate and the circuit layer during the heat cycle due to differences in their thermal expansion coefficients, the side of the back surface of the circuit layer undergoes plastic deformation to absorb the stress. The stress acting on the joining interface can be avoided to increase joining reliability of the ceramic plate and the circuit layer during the heat cycle.

Since the Fe concentration in the side of the front surface of the circuit layer is more than or equal to 0.1 wt %, the side of the front surface can be cured gradually with repeated thermal deformation of the circuit layer during the heat cycle and plastic deformation which occurs in the side of the front surface can be reduced. As a result, load acting on a solder layer which joins the front surface of the circuit layer and the heat block due to plastic deformation of the circuit layer during the heat cycle can be reduced. Even if a crack is caused in the solder layer during the heat cycle, development of the crack can be prevented.

Since the heat block is disposed between the circuit layer and the power element, heat conducted from the power element to the heat block via the solder layer is immediately distributed in a surface direction of the heat block so as to prevent temperature rise in the power element when the power element is subject to a heat cycle.

The thickness of the circuit layer may be more than or equal to 0.4 mm, the side of the back surface of the circuit layer may be defined as a section of more than or equal to 0.04 mm in thickness from the back surface toward the front surface of the circuit layer and a section less than or equal to the half of the thickness of the circuit layer, and the remainder may be defined as the side of the front surface.

With this configuration, the aforementioned operation effect is achieved more reliably.

A further aspect of the invention is a method of manufacturing a power element mounting substrate with a circuit layer brazed to a surface of a ceramic plate, a heat block constituted using an pure Cu or Cu alloy soldered to a front surface of the circuit layer and a power element soldered to a surface of the heat block, the method including: producing a stacked member by placing, on a front surface of the ceramic plate, Al-containing brazing material foil and a circuit layer material constituted using an Al alloy with Fe concentration of more than or equal to 0.05 wt % to less than or equal to 1.0 wt % and purity of more than or equal to 98.5 wt % to less than or equal to 99.95 wt % in this order; and heating the stacked member while the stacked member is pressed in the stacking direction to melt the brazing material foil, brazing the circuit layer material to a front surface of the ceramic plate to form the circuit layer; and soldering the heat block to the front surface of the circuit layer to provide the power element mounting substrate according to the aforementioned aspects.

In the method of manufacturing the power element mounting substrate, the stacked member is brazed while the stacked member is pressed in the stacking direction. The front surface of the ceramic plate and the circuit layer material can be successfully brazed together and Fe contained in the side of the surface of the circuit layer material to be brazed to the ceramic plate can be successfully dissolved into the brazing material which has melted in the joining interface. Accordingly, a power element mounting substrate having Fe concentration of more than or equal to 0.1 wt % in the side of the front surface of the circuit layer and less than 0.1 wt % in the side of the back surface of the circuit layer can be reliably produced.

A further aspect of the invention is a power module including a power element mounting substrate and a power element, the power element mounting substrate including a circuit layer brazed to a front surface of a ceramic plate, and a heat block which is constituted using a pure Cu or Cu alloy and is soldered to a front surface of the circuit layer, and the power element being soldered to a surface of the heat block, wherein the power element mounting substrate is the power element mounting substrate according to the aforementioned aspects.

According to the power element mounting substrate of the invention, even if a lead-free solder material is used to solder the circuit layer and a power element, easy development of the crack in the solder layer during the heat cycle can be prevented.

According to the power element mounting unit of the invention in which the cooler having the cooling channel formed therein is brazed on the back surface, even if the cooler is brazed directly on the back surface of the ceramic plate, generation of warping during the formation of the power element mounting unit can be prevented. Thus, decrease in reliability on the heat cycle can be avoided.

According to the power element mounting unit in which the cooler includes the top plate section and the pending section, reliability of the heat cycle of the power module can be increased without impairing the buckling strength of the pending section of the cooler.

According to the power element mounting unit which includes the circuit layer and a cooler constituted using the same material as that of the circuit layer are brazed together, even if the cooler is brazed directly on the back surface of the ceramic plate, generation of warping during the formation of the power element mounting unit can be prevented. Thus, decrease in reliability of the heat cycle can be prevented.

According to the power element mounting substrate which includes the heat block of the invention, joining reliability during the heat cycle of the power module can be increased.

DESCRIPTION OF REFERENCE NUMERALS

Figure 1:
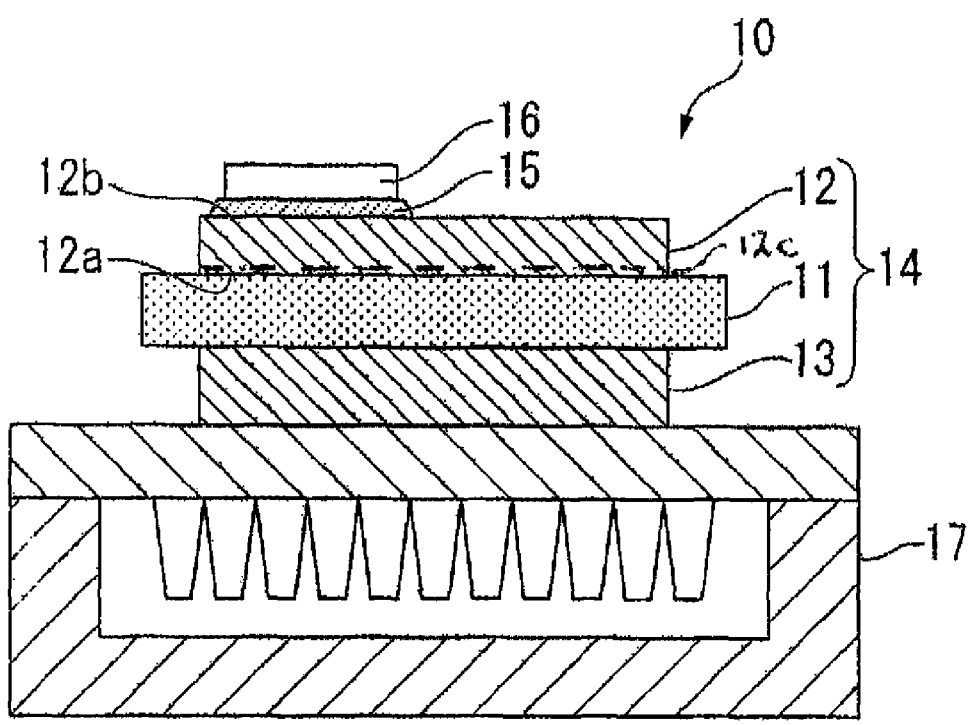
FIG. 1 is an overall view of a power module in which a power element mounting substrate according to an embodiment of the invention is used.

10: power module
11: ceramic plate
12: circuit layer
12a: surface to be brazed
12b: opposite front surface
13: metal layer
14: power element mounting substrate
15: solder layer
16: semiconductor chip (power element)
110: power module
111: ceramic plate
112: circuit layer
112a: surface to be brazed
112b: opposite surface
113: cooler
114: power element mounting unit
115: solder layer
116: power element
210: power module
211: ceramic plate
212: circuit layer
213: cooler
214: power element mounting unit
216: power element
218: surface to be brazed
219: top plate section
219a: surface section
220: opposite surface
221: pending portion
310: power module
311: ceramic plate
312: circuit layer
313: cooler
314: power element mounting unit
315: solder layer
316: power element
318: surface to be brazed
319: top plate section
410: power module
411: ceramic plate
412: circuit layer
412a: back surface
412b: front surface
413: heat block
415: power element mounting substrate
416: semiconductor chip (power element)

DETAILED DESCRIPTION OF THE INVENTION

Referring now to the drawings, embodiments of the invention will be described. FIG. 1 is an overall view of a power module in which a power element mounting substrate according to an embodiment of the invention is used.

This power module 10 includes a power element mounting substrate 14, a semiconductor chip (power element) 16 and a heat sink 17. In the power element mounting substrate 14, a circuit layer 12 is brazed to a front surface of a ceramic plate 11 and a metal layer 13 is brazed to a back surface of the ceramic plate 11. The semiconductor chip (power element) 16 is soldered to a front surface of the circuit layer 12 via a solder layer 15. The heat sink 17 is brazed or soldered to a surface of the metal layer 13.

The ceramic plate 11 may be made of AlN, $Al_2O_3$, $Si_3N_4$ and SiC. The heat sink 17 may be made of pure Al, pure Cu, Al alloy, or Cu alloy. The solder layer 15 may be made of a lead-free solder material such as Sn—Ag—Cu-containing material. A brazing material for brazing the ceramic plate 11 and the circuit layer 12, and brazing the ceramic plate 11 and the metal layer 13 may be an Al-containing brazing material such as Al—Si. In the present embodiment, the brazing material is Al—Si with Si concentration of equal to or less than 11.6 wt % and higher than the concentration of Si contained in the later-described circuit layer material which forms the circuit layer 12.

In the present embodiment, the circuit layer 12 constituted using an Al alloy with an average purity of more than or equal to 98.0 wt % and less than or equal to 99.9 wt %. The circuit layer 12 has Fe concentration of less than 0.1 wt % at the side of a surface 12a to be brazed to the ceramic plate 1. The circuit layer 12 has Fe concentration of more than or equal to 0.1 wt % at the side of a surface 12b opposite to the surface 12a to be brazed. The side of the surface 12a to be brazed of the circuit layer 12 is defined as a section of more than or equal to 10% to less than or equal to 50% of the thickness of the circuit layer 12 from the surface 12a to be brazed toward the opposite surface 12b. The remainder is defined as the side of the opposite surface 12b. The Fe concentration in the side of the surface 12a to be brazed is preferably less than or equal to 0.05 wt % from the viewpoint of detachment development ratio at the interface of the ceramic plate 11 and the circuit layer 12.

The Fe concentration in the circuit layer 12 is measured using an electron probe microanalyzer (EPMA) with the accelerating voltage of 15 kV, the current value of $5\times10^{-8}$ A and the spot size of 30 μm. The Fe concentration is obtained by measuring at ten arbitrary places on each of the side of the surface 12a to be brazed and the side of the opposite surface 12b of the circuit layer 12 and average values are obtained from the measured values.

Average purity of the circuit layer 12 is obtained by dipping the circuit layer 12 in a bath (about 100° C.) of water, hydrofluoric acid and nitric acid mixed in an equivalent amount so as to decompose the circuit layer 12 and then the decomposed sample is measured using inductivity coupled plasma-atomic emission spectrometry (ICP-AES).

Next, a method of manufacturing the thus-structured power element mounting substrate 14 will be described.

First, a circuit layer material is prepared which is identical in shape and size with the circuit layer 12. The circuit layer material is made of Al alloy with average Fe concentration of more than or equal to 0.05 wt % to less than or equal to 1.0 wt % and with purity of more than or equal to 98.5 wt % to less than or equal to 99.95 wt %. Then, a brazing material foil 12c (shown in dotted line) and the circuit layer material are placed on the front surface of the ceramic plate 11 in this order. A metal layer material which is identical in shape and size with the metal layer 13 is placed on the back surface of the ceramic plate 11 via the brazing material foil.

In this manner, a stacked member is prepared in which the brazing material foil and the circuit layer material are placed on the front surface of the ceramic plate 11 in this order and the brazing material foil and the metal layer material are placed on the back surface of the ceramic plate 11.

The stacked member is placed in an inactive atmosphere, a reduction atmosphere, or vacuum (degree of vacuum: less than or equal to $1\times10^{-5}$ Torr ($1.33\times10^{-3}$ Pa)) and is pressed in its stacking direction at the force of 0.098 to 0.294 MPa. In this state, the stacked member is heated to higher than or equal to 577° C. to lower than or equal to 660° C. to melt the brazing material foil. The circuit layer material is brazed to the front surface of the ceramic plate 11 to form the circuit layer 12. The metal layer material is brazed to the back surface of the ceramic plate 11 to form the metal layer 13. In this manner, the power element mounting substrate 14 is produced.

As described above, according to the power element mounting substrate of the present embodiment, since the Fe concentration in the side of the opposite surface 12b of the circuit layer 12 is more than or equal to 0.1 wt %, the side of the opposite surface 12b can be cured gradually with repeated thermal deformation of the circuit layer 12 during the heat cycle. Thus, plastic deformation caused in the side of the opposite surface 12b can be reduced. As a result, load acting on the solder layer 15 due to plastic deformation of the circuit layer 12 during the heat cycle can be reduced. Even if a crack is caused in the solder layer 15 during the heat cycle, development of the crack can be prevented. Even if a lead-free solder material is used to solder the circuit layer 12 and a semiconductor chip 16, easy development of the crack in the solder layer 15 during the heat cycle can be prevented.

Since the Fe concentration in the side of the surface 12a to be brazed of the circuit layer 12 is less than 0.1 wt %, even if stress is caused at the joining interface of the ceramic plate 11 and the circuit layer 12 during the heat cycle due to differences in their thermal expansion coefficients, the side of the surface 12a to be brazed of the circuit layer 12 undergoes plastic deformation to absorb the stress. Thus, the stress acting on the joining interface can be reduced and joining reliability of the ceramic plate 11 and the circuit layer 12 can be increased. If the Fe concentration in the side of the surface 12a to be brazed is less than or equal to 0.05 wt %, the operation effects are achieved more reliably.

The stacked member is pressed in its stacking direction when the circuit layer material and the ceramic plate 11 are brazed together. Thus, formation of oxide film in the joining interface of the front surface of the ceramic plate 11 and the circuit layer material can be prevented. In this manner, Fe contained in the side of the surface of the circuit layer material to be brazed to the ceramic plate 11 can be successfully dissolved into the brazing material which has melted in the joining interface. Accordingly, a power element mounting substrate 14 having Fe concentration of less than 0.1 wt % in the side of the surface 12a to be brazed of the circuit layer 12 and more than or equal to 0.1 wt % in the side of the surface 12b opposite to the surface 12a to be brazed can be reliably produced.

The Si concentration in the brazing material foil which joins the circuit layer material and the ceramic plate 11 is higher than the Si concentration in the circuit layer material. The maximum dissolution amount of Si in the circuit layer material is increased when heated for brazing. Thus, Si contained in the melted brazing material can be diffused from the side of the surface to be brazed toward the inside of the circuit layer material. As a result, the Si concentration in the side of the surface to be brazed of the circuit layer material can be increased higher than that of the side of the opposite surface. Since the maximum dissolution amount of Fe in the side of surface to be brazed becomes smaller than that of the opposite surface side, the Fe concentration in the side of the surface to be brazed can be made smaller than that in the side of the opposite surface. Accordingly, as described above, Fe contained in the side of the surface of the circuit layer material to be brazed to the ceramic plate 11 can be successfully dissolved in the brazing material which has melted in the joining interface. Thus, the power element mounting substrate 14 can be produced more reliably.

The technical scope of the invention is not limited to the illustrated embodiment. Various modifications can be made to the invention without departing from the scope and spirit of the invention. For example, the metal layer material and the circuit layer material may be formed by punching a base material, or may be formed by etching. In the illustrated embodiment, the lead-free solder material such as Sn—Ag—Cu-containing material is shown as the solder material of the solder layer 15, but the solder material is not limited thereto. For example, a solder material including Pb, such as a PbSn solder material may also be used. In this case, the same operation effects as those of the illustrated embodiment can be achieved.

Figure 3:
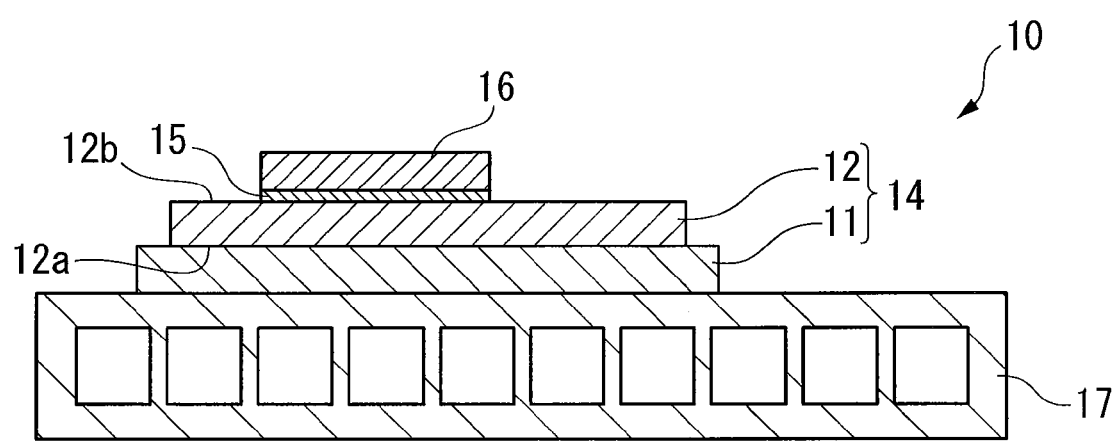
FIG. 3 is an overall view of a power module in which a power element mounting substrate according to another embodiment of the invention is used.

In the illustrated embodiment, the power element mounting substrate 14 includes the circuit layer 12, the ceramic plate 11 and the metal layer 13, and the metal layer 13 is brazed or soldered to the heat sink 17. The power element mounting substrate 14, however, may include no metal layer 13, and the back surface of the ceramic plate 11 may be directly brazed to the heat sink 17 as shown in FIG. 3. With this configuration, easy development of a crack in the solder layer 15 during the heat cycle can be prevented.

The heat sink 17 does not necessarily include a radiation fin as shown in FIG. 1. The heat sink 17 may alternatively have a structure of a perforated pipe as shown in FIG. 3.

Next, an exemplary method of manufacturing will be described.

The metal layer material and the circuit layer material were made of Al alloy with Fe concentration of about 0.3 wt % and purity of 99.5 wt %. The brazing material for brazing the metal layer 13 and the ceramic plate 11 and brazing the circuit layer 12 and the ceramic plate 11 was made of Al—Si-containing material (containing 92.5 wt % of Al and 7.5 wt % of Si). The ceramic plate 11 was made of AlN. The thickness of the metal layer 13 and the circuit layer 12 was about 0.6 mm. The thickness of the brazing material foil was about 30 μm. The thickness of the ceramic plate 11 was about 0.635 mm. The metal layer 13 was rectangular when seen in a plan view, and was about 30 mm in both length and width.

The stacked member was placed in a vacuum (degree of vacuum: less than or equal to $1 \times 10^{-5}$ Torr ($1.33 \times 10^{-3}$ Pa)) at 600 to 650° C., and was pressed in its stacking direction with the force of 0.098 to 0.294 MPa for about 1 hour. In this manner, the power element mounting substrate 14 was produced.

In the thus-produced circuit layer 12, the side of the surface 12a to be brazed and the side of the opposite surface 12b were examined using an electron probe micro analyzer (EPMA). In particular, the circuit layer 12 was cut and the cross-section was subject to line analysis using the EPMA in the direction from the surface 12a to be brazed toward the opposite surface 12b of the cross section with the accelerating voltage of 15 kV, the current value of $5 \times 10^{-8}$ A, the spot size of 1 micrometer, measuring time for each point of 5 seconds, and the movement interval of 1 micrometer. The result is shown in FIG. 2.

Figure 2:
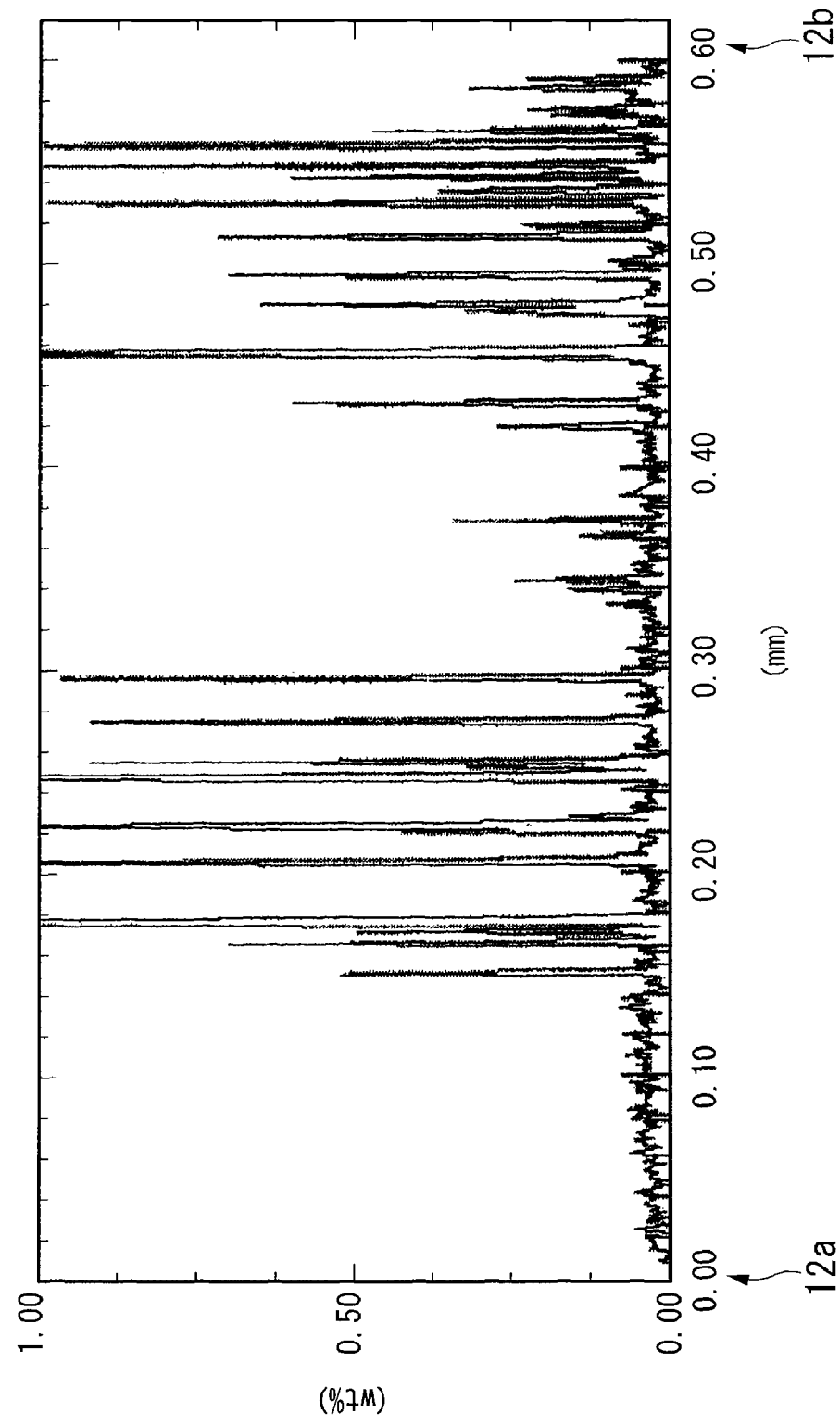
FIG. 2 is a diagram showing an exemplary Fe concentration distribution in a thickness direction of a circuit layer shown in FIG. 1.

FIG. 2 shows that Fe concentration is low in an area defined from the surface 12a to be brazed toward the opposite surface 12b up to 0.15 mm (corresponding to about 25% of thickness of the circuit layer 12), and is high in an area further toward the side of the opposite surface 12b.

The Fe concentration in the side of the surface 12a to be brazed and the side of the opposite surface 12b of the circuit layer 12 was measured using EPMA at ten arbitrary places on each of the side of the surface 12a to be brazed and the side of the opposite surface 12b of the circuit layer 12 and average values were obtained from the measured values. The measuring conditions were as follows: the accelerating voltage of 15 kV, the current value of $5 \times 10^{-8}$ A and the spot size of 30 μm.

Next, verification tests were conducted on the operation effects described above.

Eight power element mounting substrates which are different from one another in at least one of purity of Al, thickness and Fe concentration were formed in the circuit layer material which forms the circuit layer. The circuit layers of the power element mounting substrates were different from one another in at least one of Fe concentration in the side of the surface to be brazed, Fe concentration in the side of the opposite surface, thickness of the side of the surface to be brazed and thickness of the side of the opposite surface. Each of Si chips of the same performance was soldered to a surface of the circuit layer of each power element mounting substrate using a Sn—Ag—Cu-containing lead-free solder material. The obtained stacked member was subject to 2000 heat cycles, with one cycle having a temperature history of increasing the temperature from −40° C. to 105° C. in about 3 minutes and then decreasing the temperature from 105° C. to −40° C. in 10 minutes.

Then, each power element mounting substrate was cut at 5 places in its stacking direction and the cross sections were ground and polished. The cross sections were photographed using an optical microscope. The full length and detachment development length of the joining interface of the ceramic plate and the circuit layer were measured in the cross sections. Then, an average value of the ratio of the detachment development length to the full length of the joining interface, i.e., the detachment development ratio, was computed. Similarly, the full length of the solder layer which solders the circuit layer and the Si chip, and crack development length generated in the solder layer were measured. Then, an average value of the ratio of the crack development length to the full length of the solder layer, i.e., the crack development ratio, was computed.

Criteria for the evaluation of the detachment development ratio were as follows: more than or equal to 4% was C (poor), more than or equal to 2% to less than or equal to 4% was B (satisfactory) and less than 2% was A (excellent). Criteria for the evaluation of the crack development were as follows: more than 3% was C (poor) and less than or equal to 3% was B (satisfactory).

The result is shown in Table 1.

TABLE 1

| | Circuit layer material | | | Al purity after brazing (%) | Surface to be brazed side | | | Opposite surface side | | |
|---|---|---|---|---|---|---|---|---|---|---|
| | Purity (%) | Thickness (mm) | Fe Concentration (wt %) | | Thickness (mm) | Ratio (%) | Fe Concentration (wt %) | Thickness (mm) | Ratio (%) | Fe Concentration (wt %) |
| Example 1A | 99.5 | 0.6 | 0.3 | 99.3 | 0.2 | 33 | 0.04 | 0.4 | 67 | 0.3 |
| Example 2A | 99.5 | 0.8 | 0.38 | 99.4 | 0.25 | 31 | 0.04 | 0.55 | 69 | 0.3 |
| Example 3A | 99.4 | 0.6 | 0.45 | 99.4 | 0.18 | 30 | 0.06 | 0.42 | 70 | 0.4 |
| Example 4A | 99 | 0.6 | 0.74 | 98.8 | 0.1 | 17 | 0.07 | 0.5 | 83 | 0.6 |
| Example 5A | 98.5 | 0.6 | 1.0 | 98.4 | 0.04 | 7 | 0.07 | 0.56 | 93 | 0.9 |
| Comparative Example 1A | 99.99 | 0.4 | 0.001 | 99.7 | 0.4 | 100 | Not detected | None | 0 | — |
| Comparative Example 2A | 99.99 | 0.6 | 0.001 | 99.8 | 0.6 | 100 | Not detected | None | 0 | — |
| Comparative Example 3A | 99.8 | 0.6 | 0.04 | 99.7 | 0.6 | 100 | 0.03 | None | 0 | — |

TABLE 1-continued

|  |  | | Heat cycle test | | | |
|---|---|---|---|---|---|---|
|  |  | | Circuit layer/Ceramic plate | | Si chip/Circuit layer | |
|  | Brazing Si chip (0.4 mm) | | Detachment development ratio (%) | Evaluation | Crack development ratio (%) | Evaluation |
| Example 1A | Sn—4.7Ag—2.0Cu | | 0.2 | A | 1.8 | B |
| Example 2A | Sn—4.7Ag—2.0Cu | | 0.4 | A | 1 | B |
| Example 3A | Sn—4.7Ag—2.0Cu | | 0.7 | A | 1 | B |
| Example 4A | Sn—4.7Ag—2.0Cu | | 1.8 | A | 0 | B |
| Example 5A | Sn—4.7Ag—2.0Cu | | 3.0 | B | 0 | B |
| Comparative Example 1A | Sn—4.7Ag—2.0Cu | | 0 | A | 15 | C |
| Comparative Example 2A | Sn—4.7Ag—2.0Cu | | 0 | A | 12 | C |
| Comparative Example 3A | Sn—4.7Ag—2.0Cu | | 0 | A | 7 | C |

It was confirmed that both of the detachment development ratio and the crack development ratio were able to be controlled after 2000 heat cycles and the aforementioned operation effects were achieved under the following conditions: the circuit layer 12 was made of Al alloy with an average purity of more than or equal to 98.0 wt % to less than or equal to 99.9 wt %; the Fe concentration in the side of the surface 12a to be brazed to the ceramic plate 11 was less than 0.1 wt %; and Fe concentration in the side of the surface 12b opposite to the surface 12a to be brazed was more than or equal to 0.1 wt %.

Next, a power element mounting substrate 14 was produced using $Al_2O_3$ in the ceramic plate 11, and a verification test was conducted. The result of evaluation is shown in Table 2.

TABLE 2

|  | Circuit layer | | | | | | | | | |
|---|---|---|---|---|---|---|---|---|---|---|
|  | Circuit layer material | | | Al purity after brazing (%) | Surface to be brazed side | | | Opposite surface side | | |
|  | Purity (%) | Thickness (mm) | Fe Concentration (wt %) |  | Thickness (mm) | Ratio (%) | Fe Concentration (wt %) | Thickness (mm) | Ratio (%) | Fe Concentration (wt %) |
| Example 6A | 99.5 | 0.6 | 0.3 | 99.3 | 0.22 | 37 | 0.02 | 0.38 | 63 | 0.3 |
| Example 7A | 99.5 | 0.8 | 0.38 | 99.4 | 0.24 | 30 | 0.03 | 0.56 | 70 | 0.4 |
| Example 8A | 99.4 | 0.6 | 0.45 | 99.4 | 0.2 | 33 | 0.05 | 0.4 | 67 | 0.4 |
| Example 9A | 99 | 0.6 | 0.74 | 98.8 | 0.11 | 18 | 0.06 | 0.49 | 82 | 0.7 |
| Example 10A | 98.5 | 0.6 | 1.0 | 98.4 | 0.05 | 8 | 0.06 | 0.55 | 92 | 0.9 |
| Comparative Example 4A | 99.99 | 0.4 | 0.001 | 99.7 | 0.4 | 100 | Not detected | None | 0 | — |
| Comparative Example 5A | 99.99 | 0.6 | 0.001 | 99.8 | 0.6 | 100 | Not detected | None | 0 | — |
| Comparative Example 6A | 99.8 | 0.6 | 0.04 | 99.7 | 0.6 | 100 | 0.02 | None | 0 | — |

|  |  | | Heat cycle test | | | |
|---|---|---|---|---|---|---|
|  |  | | Circuit layer/Ceramic plate | | Si chip/Circuit layer | |
|  | Brazing Si chip (0.4 mm) | | Detachment development ratio (%) | Evaluation | Crack development ratio (%) | Evaluation |
| Example 6A | Sn—4.7Ag—2.0Cu | | 0 | A | 2.1 | B |
| Example 7A | Sn—4.7Ag—2.0Cu | | 0.2 | A | 1.5 | B |
| Example 8A | Sn—4.7Ag—2.0Cu | | 0.4 | A | 1.3 | B |
| Example 9A | Sn—4.7Ag—2.0Cu | | 0.9 | A | 0.9 | B |
| Example 10A | Sn—4.7Ag—2.0Cu | | 2.1 | B | 0.7 | B |
| Comparative Example 4A | Sn—4.7Ag—2.0Cu | | 0 | A | 19 | C |
| Comparative Example 5A | Sn—4.7Ag—2.0Cu | | 0 | A | 15 | C |
| Comparative Example 6A | Sn—4.7Ag—2.0Cu | | 0 | A | 10 | C |

It was confirmed that, if the ceramic plate 11 was made of Al$_2$O$_3$, both of the detachment development ratio and the crack development ratio were able to be controlled after 2000 heat cycles under the following conditions: the circuit layer 12 was made of Al alloy with an average purity of more than or equal to 98.0 wt % to less than or equal to 99.9 wt %; the Fe concentration in the side of the surface 12a to be brazed to the ceramic plate 11 was less than 0.1 wt %; and Fe concentration in the side of the surface 12b opposite to the surface 12a to be brazed was more than or equal to 0.1 wt %.

Next, a power element mounting substrate 14 was produced using Si$_3$N$_4$ in the ceramic plate 11, and a verification test was conducted. The result of evaluation is shown in Table 3.

TABLE 3

| | Circuit layer material | | | Al purity after brazing (%) | Surface to be brazed side | | | Opposite surface side | | |
|---|---|---|---|---|---|---|---|---|---|---|
| | Purity (%) | Thickness (mm) | Fe Concentration (wt %) | | Thickness (mm) | Ratio (%) | Fe Concentration (wt %) | Thickness (mm) | Ratio (%) | Fe Concentration (wt %) |
| Example 11A | 99.5 | 0.6 | 0.3 | 99.3 | 0.15 | 25 | 0.03 | 0.45 | 75 | 0.3 |
| Example 12A | 99.5 | 0.8 | 0.38 | 99.4 | 0.21 | 26 | 0.05 | 0.6 | 74 | 0.4 |
| Example 13A | 99.4 | 0.6 | 0.45 | 99.4 | 0.18 | 30 | 0.06 | 0.42 | 70 | 0.5 |
| Example 14A | 99 | 0.6 | 0.74 | 98.8 | 0.12 | 20 | 0.06 | 0.48 | 8 | 0.6 |
| Example 15A | 98.5 | 0.6 | 1.0 | 98.4 | 0.04 | 7 | 0.07 | 0.56 | 93 | 0.9 |
| Comparative Example 7A | 99.99 | 0.4 | 0.001 | 99.7 | 0.4 | 100 | Not detected | None | 0 | — |
| Comparative Example 8A | 99.99 | 0.6 | 0.001 | 99.8 | 0.6 | 100 | Not detected | None | 0 | — |
| Comparative Example 9A | 99.8 | 0.6 | 0.04 | 99.7 | 0.6 | 100 | 0.02 | None | 0 | — |

| | Brazing Si chip (0.4 mm) | Heat cycle test | | | |
|---|---|---|---|---|---|
| | | Circuit layer/ Ceramic plate | | Si chip/ Circuit layer | |
| | | Detachment development ratio (%) | Evaluation | Crack development ratio (%) | Evaluation |
| Example 11A | Sn—4.7Ag—2.0Cu | 0.3 | A | 1.5 | B |
| Example 12A | Sn—4.7Ag—2.0Cu | 0.5 | A | 1 | B |
| Example 13A | Sn—4.7Ag—2.0Cu | 0.7 | A | 0.8 | B |
| Example 14A | Sn—4.7Ag—2.0Cu | 1.8 | A | 0 | B |
| Example 15A | Sn—4.7Ag—2.0Cu | 3.3 | B | 0 | B |
| Comparative Example 7A | Sn—4.7Ag—2.0Cu | 0 | A | 13 | C |
| Comparative Example 8A | Sn—4.7Ag—2.0Cu | 0 | A | 11 | C |
| Comparative Example 9A | Sn—4.7Ag—2.0Cu | 0 | A | 7 | C |

It was confirmed that, if the ceramic plate 11 was made of Si$_3$N$_4$, both of the detachment development ratio and the crack development ratio were able to be controlled after 2000 heat cycles under the following conditions: the circuit layer 12 was made of Al alloy with an average purity of more than or equal to 98.0 wt % to less than or equal to 99.9 wt %; the Fe concentration in the side of the surface 12a to be brazed to the ceramic plate 11 was less than 0.1 wt %; and Fe concentration in the side of the surface 12b opposite to the surface 12a to be brazed was more than or equal to 0.1 wt %.

Figure 4:
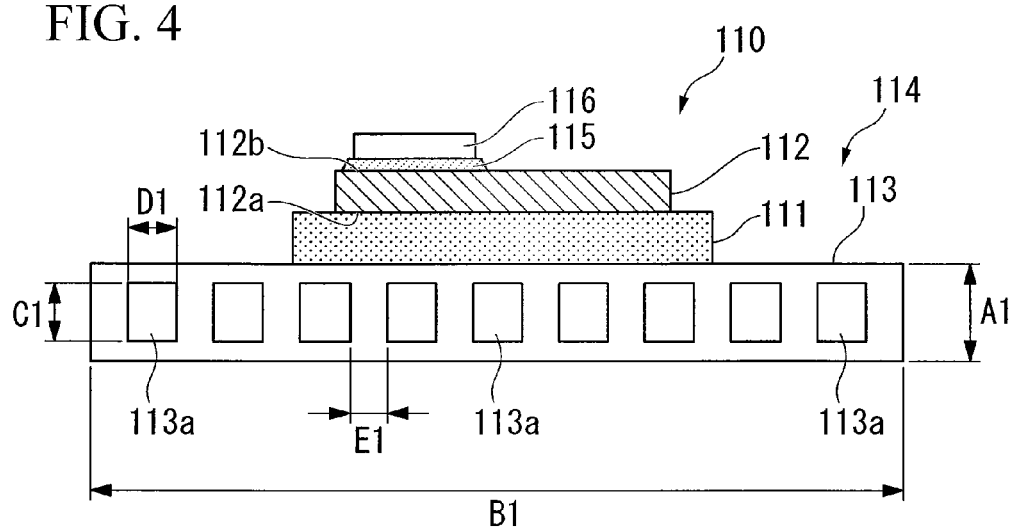
FIG. 4 is an overall view of a power module according to another embodiment of the invention.

FIG. 4 is an overall view of a power module in which a power element mounting unit according to an embodiment of the invention is used.

This power module 110 includes a power element mounting unit 114, and a power element 116. In the power element mounting unit 114, a circuit layer 112 is brazed to a front surface of a ceramic plate 111 and a cooler 113 having a cooling channel 113a therein is brazed to a back surface of the ceramic plate 111. The power element 116 is soldered to the front surface of the circuit layer 112 via a solder layer 115.

The ceramic plate 111 may be made of AlN, Al$_2$O$_3$, Si$_3$N$_4$ and SiC. The cooler 113 may be made of pure Al or Al alloy. The solder layer 115 may be made of a lead-free solder material such as Sn—Ag—Cu-containing material. A brazing material for brazing the ceramic plate 111 and the circuit layer 112, and brazing the ceramic plate 111 and the cooler 113 may be an Al-containing brazing material such as Al—Si. In the present embodiment, the brazing material is Al—Si-containing material with Si concentration of equal to or less than 11.6 wt % and higher than the concentration of Si contained in the later-described circuit layer material which forms the circuit layer 112. The entire cooler 113 is integrally made of pure Al, Al alloy or other material through casting, extrusion molding or other process.

In the present embodiment, the circuit layer 112 is made of Al alloy with an average purity of more than or equal to 98.0 wt % and less than or equal to 99.9 wt %. The circuit layer 112 has Fe concentration of less than 0.1 wt % at the side of the surface 112a to be brazed to the ceramic plate 111. The circuit layer 112 has Fe concentration of more than or equal to 0.1 wt % at the side of the surface 112b opposite to the surface 112a to be brazed. The side of the surface 112a to be brazed of the circuit layer 112 is defined as a section of more than or equal to 10% to less than or equal to 50% of the thickness of the circuit layer 112 from the surface 112a to be brazed toward the opposite surface 112b. The remainder is defined as the side of the opposite surface 112b.

The Fe concentration in the circuit layer 112 is measured using an electron probe microanalyzer (EPMA) with the accelerating voltage of 15 kV, the current value of $5 \times 10^{-8}$ A and the spot size of 30 μm. The Fe concentration is obtained by measuring at ten arbitrary places on each of the side of the surface 112a to be brazed and the side of the opposite surface 112b of the circuit layer 112 and average values are obtained from the measured values. Average purity of the circuit layer 112 is obtained by dipping the circuit layer 112 in a bath (about 100° C.) of water, hydrofluoric acid and nitric acid mixed in an equivalent amount so as to decompose the circuit layer 12 and then the decomposed sample is measured using inductivity coupled plasma-atomic emission spectrometry (ICP-AES).

Next, a method of manufacturing the thus-structured power element mounting unit 114 will be described.

First, a circuit layer material is prepared which is identical in shape and size with the circuit layer 112. The circuit layer material is made of Al alloy with average Fe concentration of more than or equal to 0.05 wt % to less than or equal to 1.0 wt % and with purity of more than or equal to 98.5 wt % to less than or equal to 99.95 wt %. Then, a brazing material foil and the circuit layer material are placed on the front surface of the ceramic plate 111 in this order. A cooler 113 is placed on the back surface of the ceramic plate 111 via the brazing material foil.

In this manner, a stacked member is prepared in which the brazing material foil and the circuit layer material are placed on the front surface of the ceramic plate 111 in this order and the brazing material foil and the cooler 113 are placed on the back surface of the ceramic plate 111.

The stacked member is placed in an inactive atmosphere, a reduction atmosphere, or vacuum (degree of vacuum: less than or equal to $1 \times 10^{-5}$ Torr ($1.33 \times 10^{-3}$ Pa)) and is pressed in its stacking direction at the force of 0.098 to 0.294 MPa. In this state, the stacked member is heated to higher than or equal to 577° C. to lower than or equal to 660° C. to melt the brazing material foil. The circuit layer material is brazed to the front surface of the ceramic plate 11 to form the circuit layer 112. The cooler 113 is brazed to the back surface of the ceramic plate 111. In this manner, the power element mounting unit 114 is produced.

As described above, according to the power element mounting unit 114 of the present embodiment, since the Fe concentration in the side of the opposite surface 12b of the circuit layer 12 is more than or equal to 0.1 wt %, flexural rigidity of the entire circuit layer 112 can be increased to reduce the difference between flexural rigidity of the cooler 113. Thus, the amount of warping caused during brazing for producing the power element mounting unit 114 can be reduced. As a result, decrease in reliability on the heat cycle can be prevented, and thus, for example, occurrence of easy development of the crack in the ceramic plate 111 can be prevented.

Since the Fe concentration in the side of the surface 112a to be brazed of the circuit layer 112 is less than 0.1 wt %, even if stress is caused at the joining interface of the ceramic plate 111 and the circuit layer 112 during the heat cycle due to differences in their thermal expansion coefficients, the side of the surface 112a to be brazed of the circuit layer 112 undergoes plastic deformation to absorb the stress. Thus, the stress acting on the joining interface can be reduced and joining reliability of the ceramic plate 111 and the circuit layer 112 can be increased. If the Fe concentration in the side of the surface 112a to be brazed is less than or equal to 0.05 wt %, the operation effects are achieved more reliably.

The stacked member is pressed in its stacking direction when the circuit layer material and the ceramic plate 111 are brazed together. Thus, formation of oxide film in the joining interface of the front surface of the ceramic plate 111 and the circuit layer material can be prevented. In this manner, Fe contained in the side of the surface of the circuit layer material to be brazed to the ceramic plate 111 can be successfully dissolved into the brazing material which has melted in the joining interface. Accordingly, a power element mounting unit 114 with Fe concentration of less than or equal to 0.1 wt % in the side of the surface 112a of the circuit layer 112 to be brazed and more than or equal to 0.1 wt % in the side of the surface 112b opposite to the surface 112a to be brazed can be reliably produced.

The Si concentration in the brazing material foil which joins the circuit layer material and the ceramic plate 111 is higher than the Si concentration in the circuit layer material. The maximum dissolution amount of Si in the circuit layer material is increased when heated for brazing. Thus, Si contained in the melted brazing material can be diffused from the side of the surface to be brazed toward the inside of the circuit layer material. As a result, the Si concentration in the side of the surface to be brazed of the circuit layer material can be increased higher than that of the side of the opposite surface. Since the maximum dissolution amount of Fe in the side of surface to be brazed becomes smaller than that of the opposite surface side, the Fe concentration in the side of the surface to be brazed can be made smaller than that in the side of the opposite surface. Accordingly, as described above, Fe contained in the side of the surface of the circuit layer material to be brazed to the ceramic plate 111 can be successfully dissolved in the brazing material which has melted in the joining interface. Thus, the power element mounting unit 114 can be produced more reliably.

In the present embodiment, since the entire cooler 113 is made of pure Al, Al alloy or other material, the power element mounting unit 114 can be produced without a complicated structure of the cooler 113. Thus, increase in manufacturing cost can be prevented. The total thermal resistance in the stacking direction of the power module 110 which includes the power element mounting unit 114 can be reduced reliably.

The technical scope of the invention is not limited to the illustrated embodiment. Various modifications can be made to the invention without departing from the scope and spirit of the invention. For example, the circuit layer material may be formed by punching a base material, or may be formed by etching. In the illustrated embodiment, the lead-free solder material such as Sn—Ag—Cu-containing material is shown as the solder material of the solder layer 5, but the solder material is not limited thereto. For example, a solder material including Pb, such as a PbSn-containing solder material may also be used.

Figure 5:
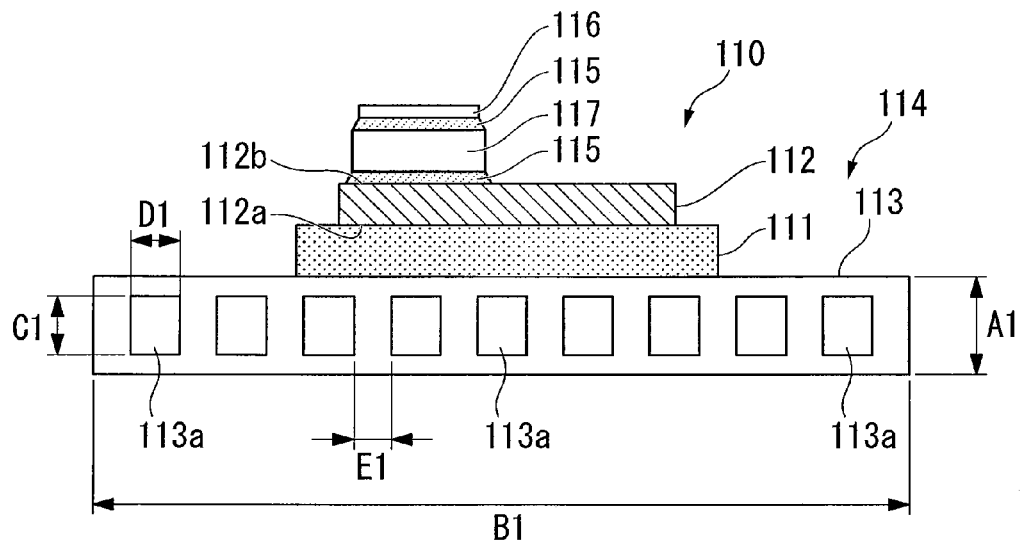
FIG. 5 is an overall view of a power module according to another embodiment of the invention.

In the illustrated embodiment, the power module 110 includes the power element 116 joined to the front surface of the circuit layer 112 via the solder layer 115. However, as shown in FIG. 5, a heat spreader 117 made of composite materials such as pure Cu, Cu alloy, Cu—Mo-containing alloy or Cu—C, may be provided between the circuit layer 112 and the power element 116. In this case, the heat generated at the power element 116 can be conducted in the stacking direction while being diffused in the direction perpendicular to the stacking direction.

Next, an exemplary method of manufacturing will be described. The circuit layer material and the cooler 113 were made of Al alloy with Fe concentration of about 0.3 wt % and purity of 99.5 wt %. The brazing material for brazing the circuit layer 112 and the ceramic plate 11 was made of a material containing Al—Si (containing 92.5 wt % of Al and 7.5 wt % of Si). The ceramic plate 111 was made of AlN. The thickness of the circuit layer 112 was about 0.8 mm. The thickness of the brazing material foil was about 30 μm. The thickness of the ceramic plate 111 was about 0.635 mm. The circuit layer 112 was rectangular when seen in a plan view, and was about 17 mm in both length and width. The ceramic plate 111 was also rectangular when seen in a plan view, and was about 20 mm in both length and width.

The height of the cooler 113, i.e., a distance A1 between the front surface to which the back surface of the ceramic plate 111 is brazed and the back surface opposite to the front surface, was about 2.5 mm. The width B1 of the cooler 113 was about 21.25 mm. The length, i.e., the dimension in the direction in which the cooling channel 113a extends (i.e., the depth direction of FIG. 4) was about 60 mm. The dimension C1 in the height direction of each cooling channel 113a which is rectangular when seen in a plan view was about 1.5 mm, and the dimension D1 in the width direction of the cooler 113 was about 1.25 mm. The cooling channels 113a were provided in the height direction middle portion of the cooler 113 and about 0.5 mm apart from both the front and back surfaces. The distance E1 between adjacent cooling channels 113a was about 1 mm.

The stacked member was placed in a vacuum (degree of vacuum: less than or equal to $1\times10^{-5}$ Torr ($1.33\times10^{-3}$ Pa)) at 600 to 650° C., and was pressed in its stacking direction with the force of 0.098 to 0.294 MPa for about 1 hour. In this manner, the power element mounting unit 114 was produced.

In the thus-produced circuit layer 112, the side of the surface 112a to be brazed and the side of the opposite surface 112b were examined using an electron probe micro analyzer (EPMA). In particular, the circuit layer 112 was cut and the cross-section was subject to line analysis using the EPMA in the direction from the surface 112a to be brazed toward the opposite surface 112b of the cross section with the accelerating voltage of 15 kV, the current value of $5\times10^{-8}$ A, the spot size of 1 micrometer, measuring time for each point of 5 seconds, and the movement interval of 1 micrometer. The result is shown in FIG. 6.

Figure 6:
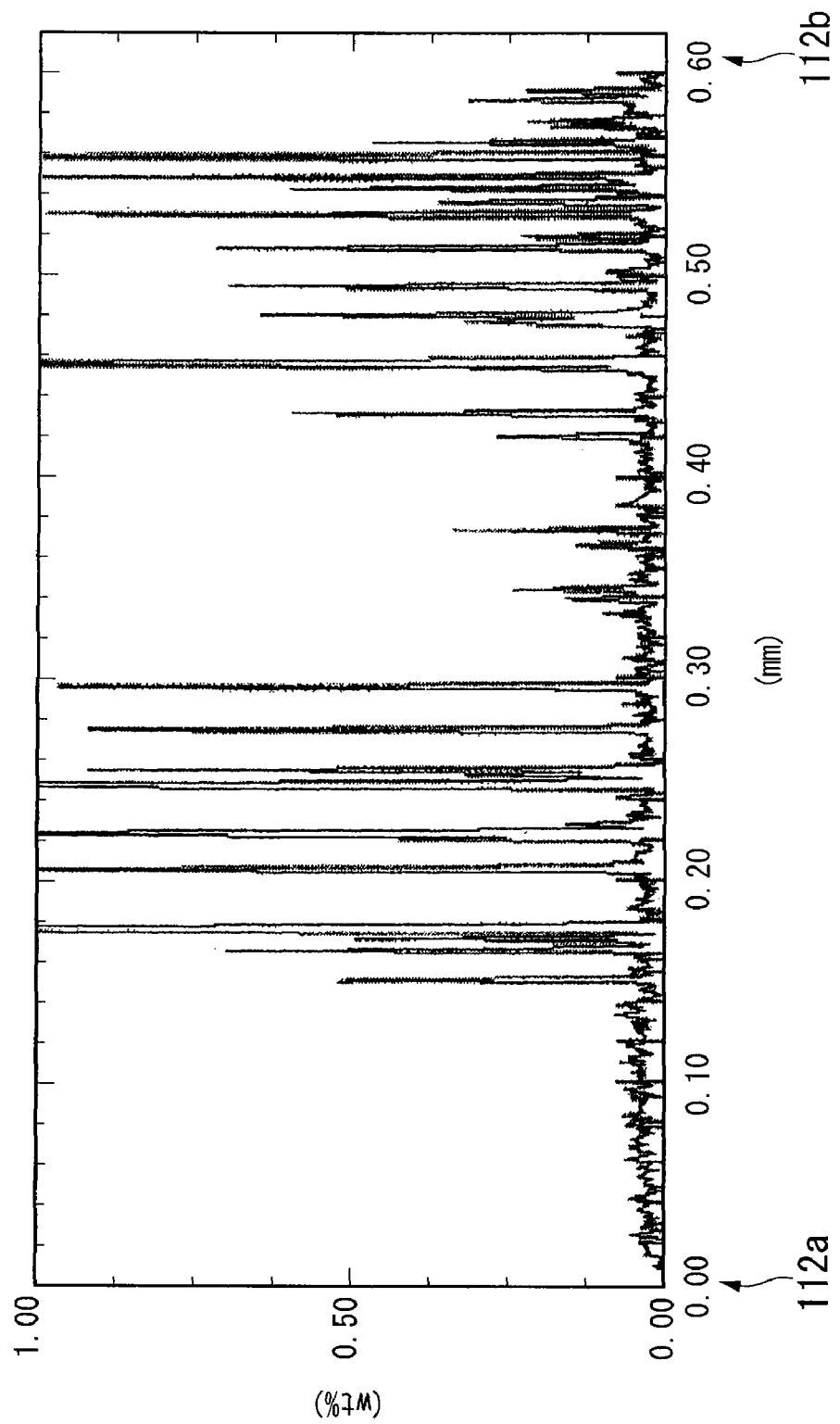
FIG. 6 is a diagram showing an exemplary Fe concentration distribution in a thickness direction of a circuit layer shown in FIG. 4.

FIG. 6 shows that Fe concentration is low in an area defined from the surface 112a to be brazed toward the opposite surface 112b up to 0.15 mm (corresponding to about 25% of thickness of the circuit layer 112), and is high in an area further toward the side of the opposite surface 112b.

The Fe concentration in the side of the surface 112a to be brazed and the side of the opposite surface 12b of the circuit layer 112 was measured using EPMA at ten arbitrary places on each of the side of the surface 112a to be brazed and the side of the opposite surface 112b of the circuit layer 112 and average values are obtained from the measured values. The measuring conditions were as follows: the accelerating voltage of 15 kV, the current value of $5\times10^{-8}$ A and the spot size of 30 μm.

Next, verification tests were conducted on the operation effects described above.

Eight power element mounting units which are different from one another in at least one of purity of Al, thickness and Fe concentration were formed in the circuit layer material which forms the circuit layer. The circuit layers of the power element mounting units were different from one another in at least one of Fe concentration in the side of the surface to be brazed, Fe concentration in the side of the opposite surface, thickness of the side of the surface to be brazed and thickness of the side of the opposite surface. Each of Si chips of the same performance was soldered to a surface of the circuit layer of each power element mounting unit using a Sn—Ag—Cu-containing lead-free solder material. The obtained stacked member was subject to 2000 heat cycles, with one cycle having a temperature history of increasing the temperature from −40° C. to 105° C. in about 3 minutes and then decreasing the temperature from 105° C. to −40° C. in 10 minutes.

Then, each power element mounting unit was cut at 5 places in its stacking direction and the cross sections were ground and polished. The cross sections were photographed using an ultrasonic imaging device (140 MHz probe). The full length and detachment development length of the joining interface of the ceramic plate and the circuit layer were measured in the cross sections. Then, an average value of the ratio of the detachment development length to the full length of the joining interface, i.e., the detachment development ratio, was computed. Similarly, in the cross section, the full length and the detachment development length of the joining interface of the ceramic plate and the cooler were measured. Then, an average value of the detachment development ratio in the joining interface was computed.

Criteria for the evaluation of the detachment development ratio were as follows: more than or equal to 5% was C (poor), more than or equal to 2% to less than or equal to 5% was B (satisfactory) and less than 2% was A (excellent).

Before soldering the Si chips to the eight power element mounting units, an amount of warping caused in each power element mounting unit was measured. Criteria for the evaluation of the amount of warping were as follows: more than or equal to 100 μm was C (poor) and less than 100 micrometer was B (satisfactory).

The result is shown in Table 4.

TABLE 4

| | Circuit layer material | | | Circuit layer | | | | | | |
|---|---|---|---|---|---|---|---|---|---|---|
| | | | | Al purity | Surface to be brazed side | | | Opposite surface side | | |
| | Purity (%) | Thickness (mm) | Fe Concentration (wt %) | after brazing (%) | Thickness (mm) | Ratio (%) | Fe Concentration (wt %) | Thickness (mm) | Ratio (%) | Fe Concentration (wt %) |
| Example 1B | 99.5 | 0.6 | 0.3 | 99.3 | 0.2 | 33 | 0.04 | 0.4 | 67 | 0.3 |
| Example 2B | 99.5 | 0.8 | 0.38 | 99.4 | 0.25 | 31 | 0.04 | 0.55 | 69 | 0.3 |
| Example 3B | 99.4 | 0.6 | 0.45 | 99.4 | 0.18 | 30 | 0.06 | 0.42 | 70 | 0.4 |
| Example 4B | 99 | 0.6 | 0.74 | 98.8 | 0.1 | 17 | 0.07 | 0.5 | 83 | 0.6 |
| Example 5B | 98.5 | 0.6 | 1.0 | 98.4 | 0.04 | 7 | 0.07 | 0.56 | 93 | 0.9 |
| Comparative Example 1B | 99.99 | 0.4 | 0.001 | 99.7 | 0.4 | 100 | Not detected | None | 0 | — |

TABLE 4-continued

| | | | | | | | | | | |
|---|---|---|---|---|---|---|---|---|---|---|
| Comparative Example 2B | 99.99 | 0.6 | 0.001 | 99.8 | 0.6 | 100 | Not detected | None | 0 | — |
| Comparative Example 3B | 99.8 | 0.6 | 0.04 | 99.7 | 0.6 | 100 | 0.03 | None | 0 | — |

| | Amount of warping during formation of power element mounting unit | | Heat cycle test | | | |
|---|---|---|---|---|---|---|
| | | | Circuit layer/ Ceramic plate | | Ceramic plate/ Cooler | |
| | Amount of warping (μm) | Evaluation | Detachment development ratio (%) | Evaluation | Detachment development ratio (%) | Evaluation |
| Example 1B | 51 | B | 0.1 | A | 0.5 | A |
| Example 2B | 46 | B | 0.3 | A | 0.6 | A |
| Example 3B | 32 | B | 0.7 | A | 1.0 | A |
| Example 4B | 20 | B | 1.6 | A | 1.9 | A |
| Example 5B | 9 | B | 2.8 | B | 3.9 | B |
| Comparative Example 1B | 162 | C | 0 | A | 0.5 | A |
| Comparative Example 2B | 143 | C | 0 | A | 0.6 | A |
| Comparative Example 3B | 105 | C | 0 | A | 1.0 | A |

It was confirmed that the amount of warping caused during brazing for producing the power element mounting unit 114 was able to be controlled and the detachment development ratio was able to be controlled after 2000 heat cycles and the aforementioned operation effects were achieved under the following conditions: the circuit layer 112 was made of Al alloy with an average purity of more than or equal to 98.0 wt % to less than or equal to 99.9 wt %; the Fe concentration in the side of the surface 112a to be brazed to the ceramic plate 111 was less than 0.1 wt %; and Fe concentration in the side of the surface 112b opposite to the surface 112a to be brazed was more than or equal to 0.1 wt %. Although not shown in Table 4, it was also confirmed that, in the illustrated power module 110, no crack occurred in the ceramic plate 111 after the ceramic plate 111 was subject to the heat cycle.

Figure 7:
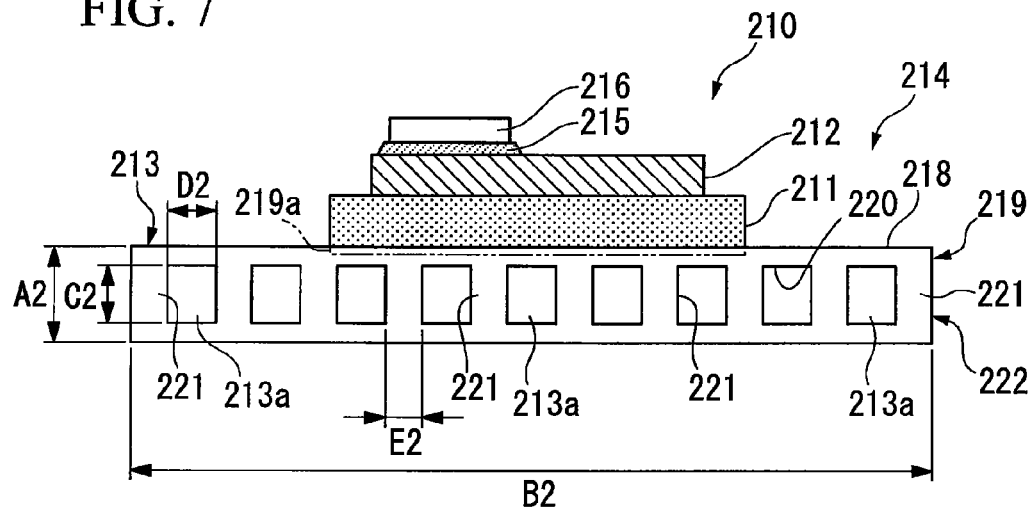
FIG. 7 is an overall view of a power module according to another embodiment of the invention.

FIG. 7 is an overall view of a power module in which a power element mounting unit according to an embodiment of the invention is used.

This power module 210 includes a power element mounting unit 214 and a power element 216. In the power element mounting unit 214, a circuit layer 212 is brazed to a front surface of a ceramic plate 211 and a cooler 213 having a cooling channel 113a therein is brazed to a back surface of the ceramic plate 211. The power element 216 is soldered to the front surface of the circuit layer 212 via a solder layer 215.

The ceramic plate 211 may be made of AlN, $Al_2O_3$, $Si_3N_4$ and SiC. The solder layer 215 may be made of a lead-free solder material such as Sn—Ag—Cu-containing material, or a solder material containing Pb such as PbSn. The circuit layer 212 may be made of pure Al or Al alloy. A brazing material for brazing the ceramic plate 211 and the circuit layer 212, and brazing the ceramic plate 211 and the cooler 213 may be an Al brazing material such as Al—Si-containing material.

In the present embodiment, the cooler 213 includes a top plate section 219 and a pending section 221. The top plate section 219 has a surface 218 to be brazed to be brazed to the ceramic plate 211. The pending section 221 is provided to suspend from a surface 220 opposite to the surface 218 to be brazed on the top plate section 219. In the illustrated example, the cooler 213 includes, in addition to the top plate section 219 and the pending section 221, a bottom plate section 222 disposed to face the opposite surface 220 and in parallel with the top plate section 219. The pending section 221 connects the top plate section 219 and the bottom plate section 222. A plurality of pending sections 221 are provided along a certain direction at predetermined intervals. The pending sections are formed as wall sections extending in a direction perpendicular to the certain direction. With this configuration, plural refrigerant supply channels 213a are formed by the opposite surface 220 of the top plate section 219, the bottom plate section 222 and the plural pending sections 221. The cooler 213 is formed as a perforated pipe with plural refrigerant supply channels 213a formed therein.

The top plate sections 219, the bottom plate section 222 and the pending section 221 are integrally made of Al alloy with an average purity of more than or equal to 98.0 wt % and less than or equal to 99.9 wt %. The cooler 113 is formed through casting, extrusion molding or other process. The surface section 219a of the top plate section 219 at the side of the surface 218 to be brazed has Fe concentration of less than 0.1 wt %. Fe concentration in the cooler 213 except for the surface section 219a is more than or equal to 0.1 wt %.

In the illustrated example, the surface 218 to be brazed is larger than the back surface of the ceramic plate 211. The ceramic plate 211 is brazed at the inner side of an outer periphery of the surface 218 to be brazed. The surface section 219a is formed on the surface 218 to be brazed only in the area where the back surface of the ceramic plate 211 is brazed.

The Fe concentration in the cooler 213 is measured using an electron probe microanalyzer (EPMA) with the accelerating voltage of 15 kV, the current value of $5 \times 10^{-8}$ A and the spot size of 30 μm. The Fe concentration is obtained by measuring at ten arbitrary places on both the surface section 219a and the cooler 213 except for the surface section 219a and average values are obtained from the measured values. Average purity of the entire cooler 213 is obtained by dipping the cooler 213 in a bath (about 100° C.) of water, hydrofluoric acid and nitric acid mixed in an equivalent amount so as to decompose the cooler 213 and then the decomposed sample is measured using inductivity coupled plasma-atomic emission spectrometry (ICP-AES).

Next, a method of manufacturing the thus-structured power element mounting unit 214 will be described.

First, the brazing material foil and the circuit layer 212 are placed on the front surface of the ceramic plate 211 in this order. The brazing material foil and the cooler 213 are placed on the back surface of the ceramic plate 211 in this order. In this manner, a stacked member is prepared in which the brazing material foil and the circuit layer 212 are placed on the front surface of the ceramic plate 211 in this order and the brazing material foil and the cooler 213 are placed on the back surface of the ceramic plate 211. The brazing material foil placed between the ceramic plate 211 and the circuit layer 212 is identical in shape and size with the circuit layer 212 when seen in a plan view. The brazing material foil placed between the ceramic plate 211 and the cooler 213 is identical in shape and size with the ceramic plate 211 when seen in a plan view.

The stacked member is placed in an inactive atmosphere, a reduction atmosphere, or vacuum (degree of vacuum: less than or equal to $1\times10^{-5}$ Torr ($1.33\times10^{-3}$ Pa)) and is pressed in its stacking direction at the force of 0.098 to 0.294 MPa. In this state, the stacked member is heated to higher than or equal to 577° C. to lower than or equal to 660° C. to melt the brazing material foil. The circuit layer 12 is brazed to the front surface of the ceramic plate 11. The cooler 213 is brazed to the back surface of the ceramic plate 211. In this manner, the power element mounting unit 214 is produced.

As described above, according to the power element mounting unit 214 of the present embodiment, the Fe concentration in the surface section 219a of the top plate section 219 at the side of the surface 218 to be brazed is less than 0.1 wt %. Even if stress is caused at the joining interface of the ceramic plate 211 and the cooler 213 during the heat cycle due to differences in their thermal expansion coefficients, the surface section 219a undergoes plastic deformation to absorb the stress. Thus, the stress generated on the joining interface can be reduced and joining reliability of the ceramic plate 211 and the cooler 213 can be increased.

Since the Fe concentration in the cooler 213 except for the surface section 219a is less than 0.1 wt %, the flexural rigidity of the cooler 213 except for the surface section 219a can be maintained at the current level. When the stacked member is pressed in the stacking direction to braze the ceramic plate 211 and the cooler 213, buckling of the pending sections 221 of the cooler 213 can be prevented even if the cooler 213 is thin.

Accordingly, reliability on the heat cycle of the power module 210 can be increased without impairing the buckling strength of the pending sections 221 of the cooler 213. If the Fe concentration in the surface section 219a of the cooler 213 is less than or equal to 0.05 wt %, the operation effects are achieved more reliably.

In the present embodiment, since the entire cooler 213 is made of the Al alloy, the power element mounting unit 214 can be produced without a complicated structure of the cooler 213. Thus, increase in manufacturing cost can be prevented. The total thermal resistance in the stacking direction of the power module 210 which includes the power element mounting unit 214 can be reduced reliably.

The technical scope of the invention is not limited to the illustrated embodiment. Various modifications can be made to the invention without departing from the scope and spirit of the invention.

Although the circuit layer 212 is made of pure Al or Al alloy in the illustrated embodiment, the circuit layer 212 may alternatively made of pure Cu or Cu alloy. Although the cooler 213 is shown as a perforated pipe with plural refrigerant supply channels 213a formed therein in the illustrated embodiment, a cooler with a single wide refrigerant supply channel formed therein may alternatively be used. A cooler with a fin brazed on the opposite surface 220 of the top plate section 219 in the wide refrigerant supply channel may also be used. Alternatively, the cooler 213 may include no bottom plate section 222 but may include the top plate section 219 and the pending section 221, and plural pending sections 221 as pins or fins may be provided to suspend on the opposite surface 220 of the top plate section 219.

Figure 8:
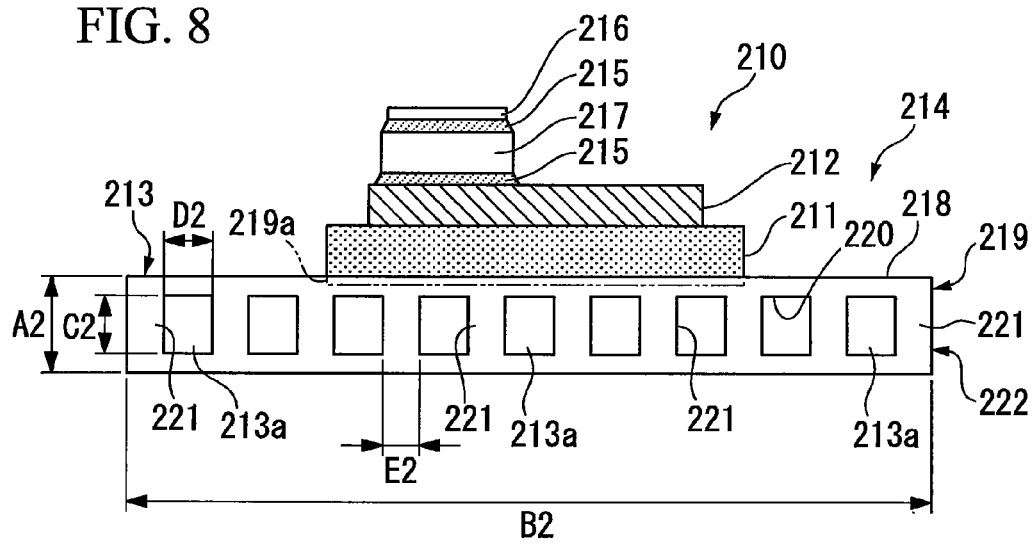
FIG. 8 is an overall view of a power module according to another embodiment of the invention.

In the illustrated embodiment, the power module 210 includes the power element 216 joined to the front surface of the circuit layer 212 via the solder layer 215. However, as shown in FIG. 8, a heat spreader 217 made of composite materials such as pure Cu, Cu alloy, Cu—Mo-containing alloy or Cu—C, may be provided between the circuit layer 212 and the power element 216. In this case, the heat generated at the power element 216 can be conducted in the stacking direction while being diffused in the direction perpendicular to the stacking direction.

Alternatively, the back surface of the ceramic plate 211 and the surface 218 to be brazed may be identical in shape and size and may be brazed together with outer peripheries corresponding to each other. In this case, the surface section 219a is formed on the entire surface 218 to be brazed.

Next, an exemplary method of manufacturing will be described.

The circuit layer 212 and the cooler 213 were made of Al alloy with Fe concentration of about 0.3 wt % and purity of 99.5 wt %. The brazing material for brazing the circuit layer 212 and the ceramic plate 211 was made of Al—Si-containing material (containing 92.5 wt % of Al and 7.5 wt % of Si). The ceramic plate 211 was made of AlN. The thickness of the circuit layer 212 was about 0.8 mm. The thickness of the brazing material foil was about 30 μm. The thickness of the ceramic plate 211 was about 0.635 mm. The circuit layer 212 was rectangular when seen in a plan view, and was about 17 mm in both length and width. The ceramic plate 211 was also rectangular when seen in a plan view, and was about 20 mm in both length and width.

The height of the cooler 213, i.e., a distance A2 between the surface 218 to be brazed and an under surface of the bottom plate section 222, was about 2.5 mm. The width B2 of the cooler 213 was about 21.25 mm. The length, i.e., the dimension in the direction in which the refrigerant supply channel 213a extends (i.e., the depth direction of FIGS. 7 and 8) was about 60 mm. The dimension C2 in the height direction of each refrigerant supply channel 213a which is rectangular when seen in a plan view was about 1.5 mm, and the dimension D2 in the width direction of the cooler 213 was about 1.25 mm. The refrigerant supply channels 213a were provided in the height direction middle portion of the cooler 213 and about 0.5 mm apart from both the surface 218 to be brazed and the under surface of the bottom plate section 222. The distance E2 between adjacent refrigerant supply channels 213a along the width direction of the cooler 213 was about 1 mm. That is, the thickness of both the top plate section 219 and the bottom plate section 222 was about 0.5 mm, and the thickness of the pending section 221 was about 1 mm.

The stacked member was placed in a vacuum (degree of vacuum: less than or equal to $1\times10^{-5}$ Torr ($1.33\times10^{-3}$ Pa)) at 600 to 650° C., and was pressed in its stacking direction with the force of 0.098 to 0.294 MPa for about 1 hour. In this manner, the power element mounting unit 214 was produced.

In the thus-produced cooler 213, the surface section 219a and the cooler 213 except for the surface section 219a were examined using an electron probe micro analyzer (EPMA). In the present embodiment, the cooler 213 was cut and the cross-section was subject to line analysis using the EPMA in an area between the surface 218 to be brazed and the opposite surface 220 of the top plate section 219 which forms the upper surface of the refrigerant supply channel 213a, i.e., the entire thickness of the top plate section 219 (about 0.50 mm). The measuring conditions were as follows: the accelerating voltage of 15 kV, the current value of $5 \times 10^{-8}$ A, the spot size of 1 micrometer, measuring time for each point of 5 seconds, and the movement interval of 1 micrometer. The result is shown in FIG. 9.

Figure 9:
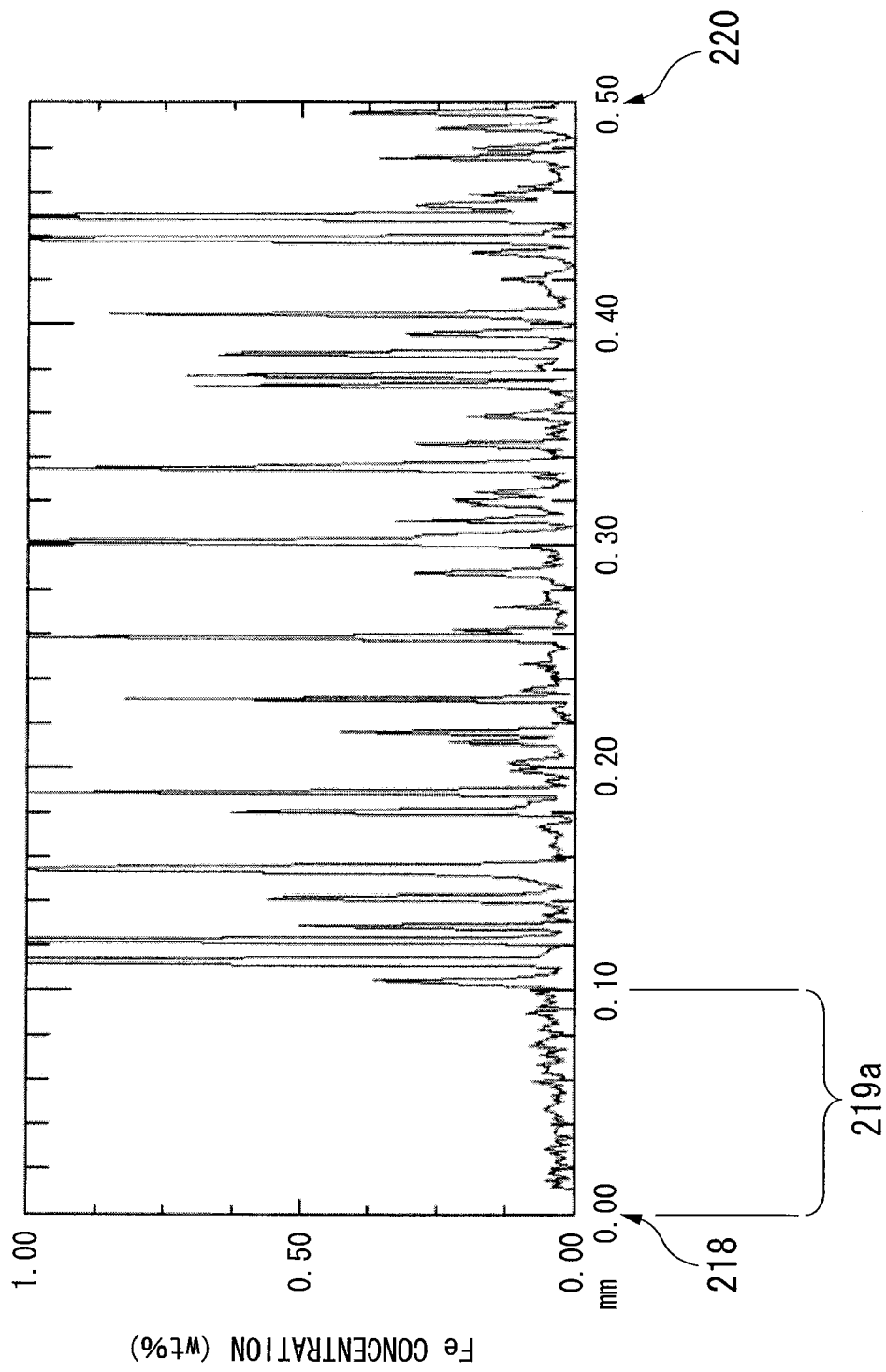
FIG. 9 is a diagram showing an exemplary Fe concentration distribution in a thickness direction of a top plate section of a cooler shown in FIG. 7.

FIG. 9 shows that Fe concentration is low in an area defined from the surface 218 to be brazed toward the opposite surface 220 up to 0.10 mm, and is high in an area further toward the side of the opposite surface 220.

The Fe concentration in the surface section 219 and the cooler 213 except for the surface section 219 was measured using EPMA at ten arbitrary places on each of the surface section 219 and the cooler 213 except for the surface section 219. Average values were obtained from the measured values. The measuring conditions were as follows: the accelerating voltage of 15 kV, the current value of $5 \times 10^{-8}$ A and the spot size of 30 μm.

Next, verification tests were conducted on the operation effects described above.

Six power element mounting units were prepared with different Al purity of Al alloy used in the cooler. The coolers of the power element mounting units were different from one another in at least one of the thickness of the surface section, Fe concentration in the surface section, and Fe concentration in the cooler except for the surface section. In the example, the coolers were made of four Al alloys which are different from one another in the Al purity within the range of more than or equal to 98.0 wt % to less than or equal to 99.9 wt %. In the comparative example, the coolers were made of two Al alloys which are different from each other in the Al purity within the range of less than 98.0 wt %. The circuit layers of the example and the comparative example were prepared using Al alloy with Al purity of 99.5 wt %. Dimensions of each member which constitutes each power element mounting unit, materials of the ceramic plate and the brazing material were the same as those shown in the aforementioned examples.

Each of Si chips of the same performance was soldered to a surface of the circuit layer of each power element mounting unit using a Sn—Ag—Cu-containing lead-free solder material. The obtained stacked member was subject to 2000 heat cycles, with one cycle having a temperature history of increasing the temperature from −40° C. to 125° C. in about 3 minutes and then decreasing the temperature from 125° C. to −40° C. in 10 minutes.

Then, each power element mounting substrate was cut at 5 places in its stacking direction and the cross sections were ground and polished. The full length and detachment development length of the joining interface of the ceramic plate and the cooler were measured in the cross sections. Then, an average value of the ratio of the detachment development length with respect to the full length of the joining interface, i.e., the detachment development ratio, was computed.

The result is shown in Table 5.

TABLE 5

| | Cooler | | | |
|---|---|---|---|---|
| | Surface section | | section except for surface section | Detachment development ratio (%) |
| | Thickness (μm) | Fe Concentration (wt %) | Fe Concentration (wt %) | |
| Example 1C | 110 | 0.04 | 0.34 | 0 |
| Example 2C | 180 | 0.03 | 0.28 | 0 |
| Example 3C | 220 | 0.03 | 0.19 | 0 |
| Example 4C | 70 | 0.05 | 0.65 | 0 |
| Comparative Example 1C | 30 | 0.08 | 0.99 | 1.1 |
| Comparative Example 2C | 15 | 0.09 | 1.12 | 2.9 |

It was confirmed that the detachment development ratio was able to be controlled after 2000 heat cycles and the aforementioned operation effects were achieved under the following conditions: the cooler 213 was made of Al alloy with an average purity of more than or equal to 98.0 wt % to less than or equal to 99.9 wt %; the Fe concentration in the surface section 219a was less than 0.1 wt %; and Fe concentration in the area of the cooler 213 except for the surface section 219a was more than or equal to 0.1 wt %. It was also confirmed that a power element mounting unit with a cooler made of Al alloy with an average purity of more than 99.9 wt % or pure Al brazed to the ceramic plate cannot be formed due to buckling of the pending section.

Figure 10:
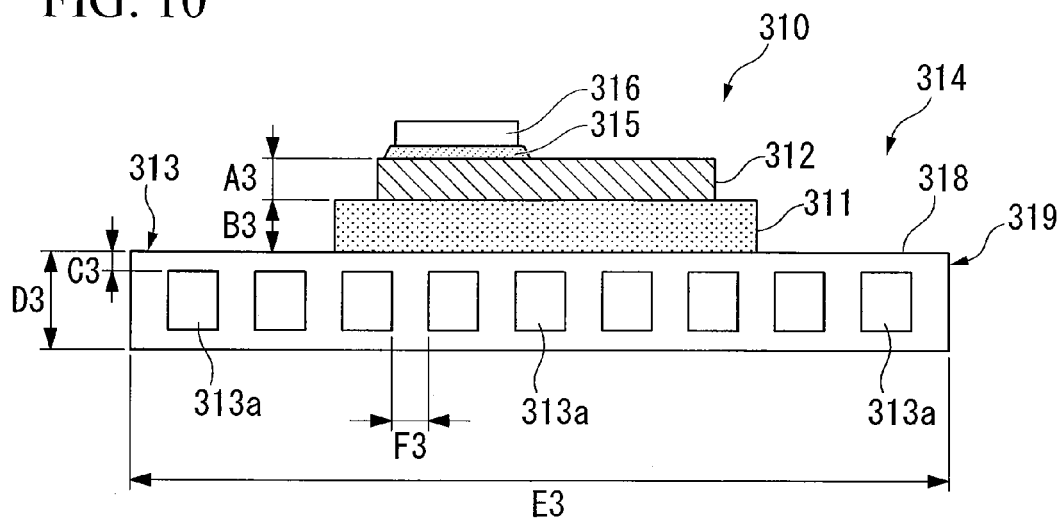
FIG. 10 is an overall view of a power module according to another embodiment of the invention.

FIG. 10 is an overall view of a power module in which a power element mounting unit according to an embodiment of the invention is used.

This power module 310 includes a power element mounting unit 314 and a power element 316. In the power element mounting unit 314, a circuit layer 312 is brazed to a front surface of a ceramic plate 311 and a cooler 313 having a cooling channel 313a therein is brazed to a back surface of the ceramic plate 311. The power element 316 is soldered to the front surface of the circuit layer 312 via a solder layer 315. A cooler 313 is made of the same material as that of the circuit layer 312.

The ceramic plate 311 may be made of AlN, $Al_2O_3$, $Si_3N_4$ and SiC. The circuit layer 312 and the cooler 313 may be made of pure Al or Al alloy. The solder layer 315 may be made of a lead-free solder material such as Sn—Ag—Cu-containing material. A brazing material for brazing the ceramic plate 311 and the circuit layer 312, and brazing the ceramic plate 311 and the cooler 313 may be an Al-containing brazing material such as Al—Si-containing materials.

The entire cooler 313 is integrally made of pure Al, Al alloy or other material through casting, extrusion molding or other process.

In the present embodiment, assuming that the thickness of the circuit layer 312 be A3, the thickness of the ceramic plate 311 be B3, and thickness of a top plate section 319 of the cooler 313 having a surface 318 to be brazed to the ceramic plate 311 be C3, $0.75 \cdot B3 < C3 < 1.5 \cdot A3 < 3 \cdot B3$ is satisfied. In the present embodiment, the thickness C3 of the top plate section 319 corresponds to the distance between the surface 318 to be brazed and an upper surface of the cooling channel 313a.

Next, a method of manufacturing the thus-structured power element mounting unit 314 will be described.

First, a brazing material foil and the circuit layer 312 are placed on the front surface of the ceramic plate 311 in this order. The cooler 313 is placed on the back surface of the ceramic plate 311 via a brazing material foil.

In this manner, a stacked member is prepared in which the brazing material foil and the circuit layer 312 are placed on the front surface of the ceramic plate 311 in this order and the brazing material foil and the cooler 313 are placed on the back surface of the ceramic plate 311.

The stacked member is placed in an inactive atmosphere, a reduction atmosphere, or vacuum (degree of vacuum: less than or equal to $1 \times 10^{-5}$ Torr ($1.33 \times 10^{-3}$ Pa)) and is pressed in its stacking direction at the force of 0.098 to 0.294 MPa. In this state, the stacked member is heated to higher than or equal to 577° C. to lower than or equal to 660° C. to melt the brazing material foil. The circuit layer 312 is brazed to the front surface of the ceramic plate 311. The cooler 313 is brazed to the back surface of the ceramic plate 311. In this manner, the power element mounting unit 314 is produced.

As described above, according to the power element mounting unit 314 of the present embodiment, assuming the thickness of the circuit layer 312 be A3, the thickness of the ceramic plate 311 be B3 and the thickness of the top plate section 319 of the cooler 313 be C3, C3<1.5·A3 is satisfied. Thus, difference in flexural rigidity of the cooler 313 and flexural rigidity of the circuit layer 312 can be decreased and an amount of warping caused during forming the power element mounting unit 314 can be reduced. And thus development of a crack in the solder layer 315 which joins the power element 316 to a front surface of the circuit layer 312 in power module 310 can be prevented.

Since 1.5·A3<3·B3 is satisfied, elastic deformation of the power module 310 along the surface direction of the front surface of the circuit layer 312 during the heat cycle can be avoided by the ceramic plate 311. Even if a crack is caused in the solder layer 315, development of the crack can be prevented. Since 0.75·B3<C3 is satisfied, easy deformation of the top plate section 319 of the cooler 313 caused from decreased difference in flexural rigidity of the cooler 313 and flexural rigidity of the circuit layer 312 can be prevented. Thus, the power element mounting unit 314 cannot become unusable.

In the present embodiment, since the entire cooler 313 is made of pure Al, Al alloy or other material, the power element mounting unit 314 can be produced without a complicated structure of the cooler 313. Thus, increase in manufacturing cost can be prevented.

The technical scope of the invention is not limited to the illustrated embodiment. Various modifications can be made to the invention without departing from the scope and spirit of the invention.

Figure 11:
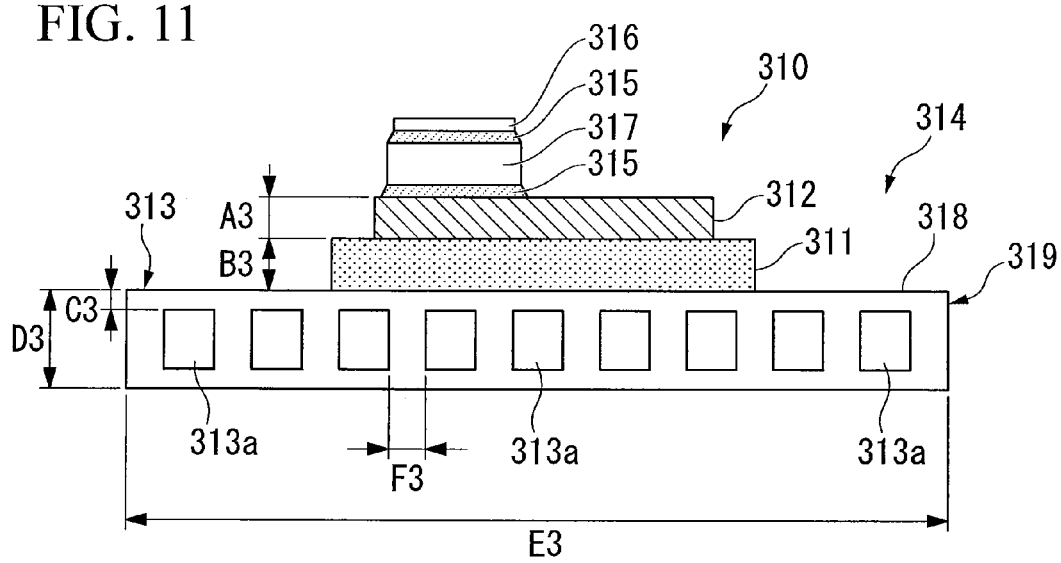
FIG. 11 is an overall view of a power module according to another embodiment of the invention.

In the illustrated embodiment, the power module 310 includes the power element 316 joined to the front surface of the circuit layer 312 via the solder layer 315. However, as shown in FIG. 11, a heat spreader 317 made of composite materials such as pure Cu, Cu alloy, Cu—Mo-containing alloy or Cu—C, may be provided between the circuit layer 312 and the power element 116. In this case, the heat generated at the power element 316 can be conducted in the stacking direction while being diffused in the direction perpendicular to the stacking direction.

Next, an exemplary method of manufacturing will be described.

The circuit layer 312 and the cooler 313 were made of Al alloy with purity of 99.5 wt %. The brazing material for brazing the circuit layer 312 and the ceramic plate 311 and brazing the cooler 313 and the ceramic plate 311 was made of Al—Si-containing material (containing 92.5 wt % of Al and 7.5 wt % of Si). The ceramic plate 311 was made of AlN. The thickness A3 of the circuit layer 312 was 400 µm, 600 µm or 800 µm. The thickness of the brazing material foil was about 30 µm. The thickness B3 of the ceramic plate 311 was about 500 µm or 635 µm. The circuit layer 312 was rectangular when seen in a plan view, and was about 17 mm in both length and width. The ceramic plate 311 was also rectangular when seen in a plan view and was about 20 mm in both length and width.

The height of the cooler 313, i.e., a distance D3 between the surface 318 to be brazed of the top plate section 319 and the back surface opposite to the surface 318 to be brazed, was about 2.5 mm. The length, i.e., the dimension in the direction in which the cooling channel 313a extends (i.e., the depth direction of FIG. 10) was about 60 mm. The cooling channels 313a, each rectangular when seen in a plan view, were provided in the height direction middle portion of the cooler 313 and about 0.5 mm apart from both the surface 318 to be brazed and back surface. The thickness C3 of the top plate section 319 was about 500 µm. The distance F3 between adjacent cooling channels 313a in the cooler 313 was about 1 mm. The stacked member was placed in a vacuum (degree of vacuum: less than or equal to $1 \times 10^{-5}$ Torr ($1.33 \times 10^{-3}$ Pa)) at 600 to 650° C. and was pressed in its stacking direction with the force of 0.098 to 0.294 MPa for about 1 hour. In this manner, the power element mounting unit 314 was produced.

Next, verification tests were conducted on the operation effects described above.

Six power element mounting units which were different in thickness of at least one of the circuit layer, the ceramic plate and the top plate section of the cooler were prepared. Other sections of the power element mounting units were the same as those of the aforementioned examples. Each of Si chips of the same performance was soldered to a surface of the circuit layer of each power element mounting substrate using a Sn—Ag—Cu-containing lead-free solder material. The obtained stacked member was subject to 2000 heat cycles, with one cycle having a temperature history of increasing the temperature from −40° C. to 105° C. in about 3 minutes and then decreasing the temperature from 105° C. to −40° C. in 10 minutes.

Then, each power element mounting unit was cut at 5 places in its stacking direction and the cross sections were ground and polished. The cross sections were photographed using an optical microscope. The full length and a detachment development length of the joining interface of the ceramic plate and the circuit layer were measured in the cross sections. Then, average values of the ratio of crack development length with respect to the full length of the solder layer, i.e., the crack development ratio, were computed.

Before soldering the Si chip to each of the six power element mounting units, an amount of warping caused in each power element mounting unit was measured.

The result is shown in Table 6.

TABLE 6

|  | A (µm) | B (µm) | C (µm) | Warping (µm) | Crack development ratio (%) |
| --- | --- | --- | --- | --- | --- |
| Example 1D | 600 | 635 | 500 | 51 | 0.2 |
| Example 2D | 800 | 635 | 500 | 35 | 0.4 |
| Example 3D | 400 | 500 | 500 | 44 | 0 |
| Example 4D | 600 | 500 | 500 | 28 | 0.1 |

TABLE 6-continued

|  | A (μm) | B (μm) | C (μm) | Warping (μm) | Crack development ratio (%) |
|---|---|---|---|---|---|
| Comparative Example 1D | 600 | 635 | 1000 | 317 | 0.3 |
| Comparative Example 2D | 1500 | 635 | 500 | −70 | 3.9 |

It was confirmed that, if the relationship among the thickness A3 of the circuit layer 12, the thickness B3 of the ceramic plate 11 and the thickness C3 of the top plate section 19 of the cooler 13 satisfies 0.75·B3<C3<1.5·A3<3·B3, the amount of warping caused during brazing for producing the power element mounting unit 14 was able to be controlled and the crack development ratio was able to be controlled after 2000 heat cycles. Thus, the aforementioned operation effects were achieved. Although not shown in Table 6, it was also confirmed that, in the power module 310 of the example, no crack was caused in the ceramic plate 311 even after the power module 310 was subject to the heat cycle.

Figure 12:
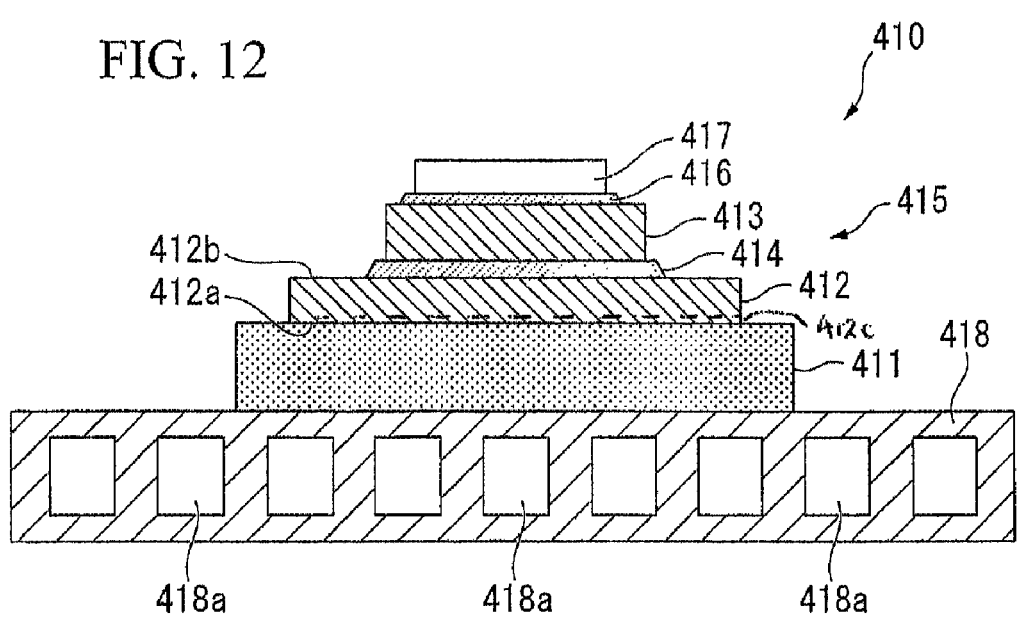
FIG. 12 is an overall view of a power module in which a power element mounting substrate according to another embodiment of the invention is used.

FIG. 12 is an overall view of a power module in which a power element mounting substrate according to an embodiment of the invention is used.

This power module 410 includes a power element mounting substrate 415 and a semiconductor chip (power element) 417. In the power element mounting substrate 415, a circuit layer 412 is brazed to a front surface of a ceramic plate 411, and a heat block 413 which is made of pure Cu or Cu alloy is soldered to a front surface 412b of the circuit layer 412 via a first solder layer 414. The semiconductor chip (power element) 417 is soldered to a surface of the heat block 413 via the second solder layer 416.

In the present embodiment, the power element mounting substrate 415 further includes a cooler 418 brazed to a back surface of the ceramic plate 411. In the illustrated example, the cooler 418 is a perforated pipe with plural refrigerant supply channels 418a formed therein. The heat block 413 is made of Cu alloy or pure Cu with purity of more than or equal to 50 wt %.

The ceramic plate 411 may be made of AlN, $Al_2O_3$, $Si_3N_4$ and SiC. The first solder layer 414 and the second solder layer 416 may be made of a lead-free solder material such as Sn—Ag—Cu-containing material, or a solder material containing Pb such as PbSn. The cooler 418 may be made of pure Al or Al alloy. A brazing material for brazing the ceramic plate 411 and the circuit layer 412, and brazing the ceramic plate 411 and the cooler 418 may be an Al-containing brazing material such as Al—Si. In the present embodiment, the brazing material has Si concentration of equal to or less than 11.6 wt % and higher than the Si concentration in the later-described circuit layer material which forms the circuit layer 412.

In the present embodiment, the circuit layer 412 is made of Al alloy with an average purity of more than or equal to 98.0 wt % and less than or equal to 99.9 wt %. The Fe concentration in the side of the front surface 412b to which the heat block 413 is soldered is more than or equal to 0.1 wt %. The Fe concentration in the side of the back surface 412a to which the ceramic plate 411 is brazed is less than 0.1 wt %.

The thickness of the circuit layer 412 is more than or equal to 0.4 mm. The side of the back surface 412a of the circuit layer 412 is defined as a section of more than or equal to 0.04 mm from the back surface 412a toward the front surface 412b of the circuit layer 412 and of less than or equal to the half of the thickness of the circuit layer 412. The remainder is defined as the side of the front surface 412b. The Fe concentration in the side of the back surface 412a is preferably less than or equal to 0.05 wt % from the viewpoint of detachment development ratio at the interface of the ceramic plate 411 and the back surface 412a of the circuit layer 412.

The side of the back surface 412a and the side of the front surface 412b of the circuit layer 412 are defined in the following manner. A border of the areas, one having Fe concentration of more than or equal to 0.1 wt % and the other having Fe concentration of less than 0.1 wt %, was determined from the data obtained in the following manner. The circuit layer 412 was cut and the cross section was subject to line analysis using an electron probe micro analyzer (EPMA) from the back surface 412a toward the front surface 412b. The measuring conditions were as follows: accelerating voltage of 15 kV; current value of $5\times10^{-8}$ A; spot size of 1 micrometer; measuring time for each point of 5 seconds; and movement interval of 1 micrometer.

Then, Fe concentration in each of the thus-specified side of the back surface 412a and side of the front surface 412b is obtained by computing average values of measured values at ten arbitrary places on the cross section with the following conditions in the EPMA device: accelerating voltage of 15 kV; current value of $5\times10^{-8}$ A; and spot size of 30 μm.

Average purity of the circuit layer 412 is obtained by dipping the circuit layer 412 in a bath (about 100° C.) of water, hydrofluoric acid and nitric acid mixed in an equivalent amount so as to decompose the circuit layer 412 and then the decomposed sample is measured using inductivity coupled plasma-atomic emission spectrometry (ICP-AES).

Next, a method of manufacturing the thus-structured power element mounting substrate 415 will be described. First, a circuit layer material which is identical in shape and size with the circuit layer 412 is prepared. The circuit layer material is made of Al alloy with average Fe concentration of more than or equal to 0.05 wt % to less than or equal to 1.0 wt % and with purity of more than or equal to 98.5 wt % to less than or equal to 99.95 wt %. Then, a brazing material foil 412c (shown in dotted line) and the circuit layer material are placed on the front surface of the ceramic plate 411 in this order. A cooler 418 is placed on the back surface of the ceramic plate 411 via the brazing material foil.

In this manner, a stacked member is prepared in which the brazing material foil and the circuit layer material are placed on the front surface of the ceramic plate 411 in this order and the brazing material foil and the cooler 418 are placed on the back surface of the ceramic plate 411.

The stacked member is placed in an inactive atmosphere, a reduction atmosphere, or vacuum (degree of vacuum: less than or equal to $1\times10^{-5}$ Torr ($1.33\times10^{-3}$ Pa)) and is pressed in its stacking direction at the force of 0.098 to 0.294 MPa. In this state, the stacked member is heated to higher than or equal to 577° C. to lower than or equal to 660° C. to melt the brazing material foil. The circuit layer material is brazed to the front surface of the ceramic plate 411 to form the circuit layer 412. The cooler 418 is brazed to the back surface of the ceramic plate 411.

Then, the heat block 413 is soldered to the front surface 412b of the circuit layer 412 via the first solder layer 414. In this manner, the power element mounting substrate 415 is produced.

As described above, according to the power element mounting substrate 415 of the present embodiment, since the Fe concentration in the side of the back surface 412a of the circuit layer 412 is less than 0.1 wt %, even if stress is caused at the joining interface of the ceramic plate 411 and the circuit layer 412 during the heat cycle due to differences in their thermal expansion coefficients, the side of the back surface 412a of the circuit layer 412 undergoes plastic deformation to absorb the stress. Thus, the stress acting on the joining interface can be reduced and joining reliability of the ceramic plate 411 and the circuit layer 412 during the heat cycle can be increased.

Since the Fe concentration in the side of the front surface 412b of the circuit layer 412 is more than or equal to 0.1 wt %, the side of the front surface 412b can be cured gradually with repeated thermal deformation of the circuit layer 412 during the heat cycle. Thus, plastic deformation caused in the side of the front surface 412b can be reduced. Accordingly, the load due to plastic deformation of the circuit layer 412 acting on the first solder layer 414 which joins the front surface 412b of the circuit layer 412 and the heat block 413 during the heat cycle can be reduced. Thus, if a crack occurs in the first solder layer 414 during the heat cycle, development of the crack can be prevented.

Since the heat block 413 is disposed between the circuit layer 412 and the semiconductor chip 417, heat conducted from the semiconductor chip 417 to the heat block 413 via the second solder layer 416 can immediately be distributed along the surface of the heat block 413. Thus, temperature rise in the semiconductor chip 417 during the heat cycle can be prevented.

In the present embodiment, the thickness of the circuit layer 412 is more than or equal to 0.4 mm. The side of the back surface 412a of the circuit layer 412 is defined as a section of more than or equal to 0.04 mm apart from the back surface 412a toward the front surface 412b of the circuit layer 412 and of less than or equal to the half of the thickness of the circuit layer 412. The remainder is defined as the side of the front surface 412b. Accordingly, aforementioned operation effect is achieved more reliably. Since the thickness of the circuit layer 412 is more than or equal to 0.4 mm, general requirement specification of the power module 410 can be reliably satisfied.

According to the method of manufacturing the power element mounting substrate of the present embodiment, the stacked member is pressed in its stacking direction when the circuit layer material and the ceramic plate 411 are brazed together. Thus, formation of oxide film in the joining interface of the front surface of the ceramic plate 411 and the circuit layer material can be prevented. In this manner, Fe contained in the side of the surface of the circuit layer material to be brazed to the ceramic plate 411 can be successfully dissolved into the brazing material which has melted in the joining interface. Accordingly, the power element mounting substrate 415 with Fe concentration of more than or equal to 0.1 wt % in the side of the front surface 412b of the circuit layer 412 and less than 0.1 wt % in the side of the back surface 412b of the circuit layer 412 is can be reliably produced.

The Si concentration in the brazing material foil which joins the circuit layer material and the ceramic plate 411 is higher than the Si concentration in the circuit layer material. The maximum dissolution amount of Si in the circuit layer material is increased when heated for brazing. Thus, Si contained in the melted brazing material can be diffused from the side of the surface to be brazed toward the inside of the circuit layer material. As a result, the Si concentration in the side of the surface to be brazed of the circuit layer material can be increased higher than that of the side of the surface opposite to the surface to be brazed. Since the maximum dissolution amount of Fe in the side of surface to be brazed becomes smaller than that of the opposite surface side, the Fe concentration in the side of the surface to be brazed can be made smaller than that in the side of the opposite surface. Accordingly, as described above, Fe contained in the side of the surface of the circuit layer material to be brazed to the ceramic plate 411 can be successfully dissolved in the brazing material which has melted in the joining interface. Thus, the power element mounting substrate 415 can be produced more reliably.

The technical scope of the invention is not limited to the illustrated embodiment. Various modifications can be made to the invention without departing from the scope and spirit of the invention.

For example, the circuit layer material may be formed by punching a base material, or may be formed by etching.

In the illustrated embodiment, the cooler 418 of power element mounting substrate 415 is a perforated pipe having plural refrigerant supply channels 418a therein. The cooler 418, however, does not necessarily include a refrigerant supply channel 418a or may include only one refrigerant supply channel 418a. A cooling fin may be provided within the refrigerant supply channel 418a. The power element mounting substrate may include no cooler 418.

Next, an exemplary method of manufacturing will be described.

The circuit layer material and the cooler 418 were made of Al alloy with Fe concentration of 0.3 wt % and purity of 99.5 wt %. The heat block 413 was made of oxygen-free copper (OFC) with purity of 99.99 wt %. The brazing material for brazing the ceramic plate 411 and the circuit layer material and the cooler 418 and brazing the ceramic plate 411 and the cooler 418 was made of Al—Si-containing material (92.5 wt % of Al and 7.5 wt % of Si). The first solder layer 414 was made of Sn—Ag—Cu-containing material. The ceramic plate 411 was made of AlN.

The thickness of the circuit layer material (circuit layer 412) was 0.6 mm. The thickness of the brazing material foil was about 30 μm. The thickness of the ceramic plate 4 was 0.635 mm. The thickness of the heat block 413 was 1.5 mm. The circuit layer material (circuit layer 412) was rectangular when seen in a plan view and was 17 mm in width and 36 mm in length. The ceramic plate 411 was also rectangular when seen in a plan view and was 20 mm in width and 40 mm in length. The heat block 413 was also rectangular when seen in a plan view and was 15 mm in width and 30 mm in length.

The cooler 418 was 2.5 mm in height and 22 mm in width. The length of the cooler 418, i.e., dimension in the direction in which the refrigerant supply channel 418a extends (depth direction of FIG. 12) was 50 mm. Each refrigerant supply channel 418a, rectangular when seen in a front view, was 1.5 mm in the height direction of the cooler 418, 1.25 mm in the width direction of the cooler 418.

The stacked member is placed in a vacuum (degree of vacuum: less than or equal to $1 \times 10^{-5}$ Torr ($1.33 \times 10^{-3}$ Pa)) and is pressed in its stacking direction at the force of 0.098 to 0.294 MPa for about an hour. In this state, the circuit layer material is brazed to the front surface of the ceramic plate 411 to form the circuit layer 412 and the cooler 418 is brazed to the back surface of the ceramic plate 411.

Then, the heat block 413 is soldered to the front surface 412b of the circuit layer 412 via the first solder layer 414. In this manner, the power element mounting substrate 415 is produced.

The side of the back surface 412a and the side of the front surface 412b of the circuit layer 412 of the power element mounting substrate 415 were examined using an electron probe micro analyzer (EPMA). In particular, the circuit layer 412 was cut and the cross-section was subject to line analysis using the EPMA from the back surface 412a toward the front surface 412b under the following conditions: accelerating voltage of 15 kV; current value of 5×10⁻⁸ A; spot size of 1 micrometer; measuring time for each point of 5 seconds; and movement interval of 1 micrometer. The result is shown in FIG. 13.

Figure 13:
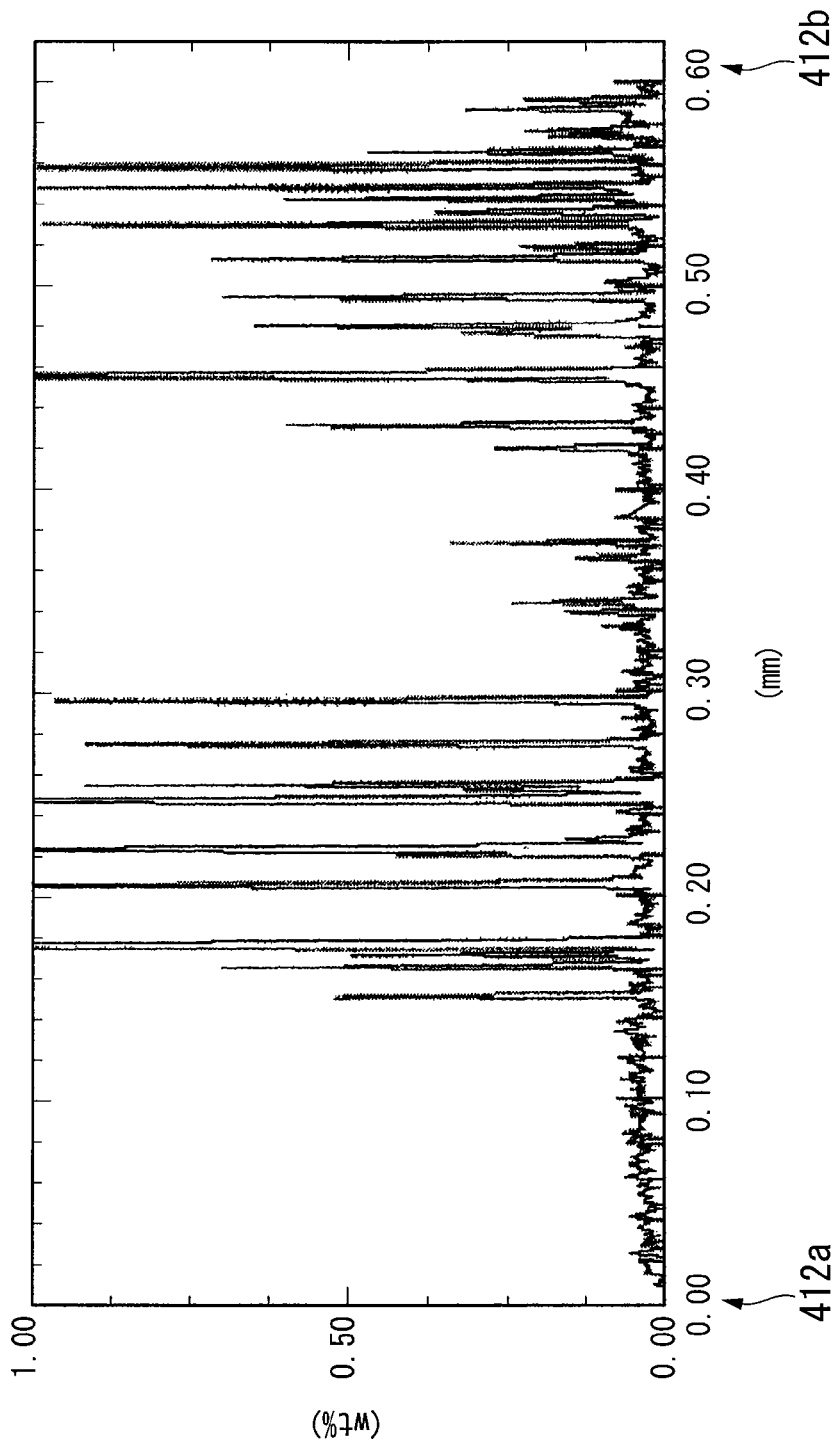
FIG. 13 is a diagram showing an exemplary Fe concentration distribution in a thickness direction of a circuit layer shown in FIG. 12.

FIG. 13 shows that Fe concentration is low in an area defined from the back surface 412a toward the front surface 412b of the circuit layer 412 up to 0.15 mm (corresponding to about 25% of thickness of the circuit layer 412), and is high in an area further toward the side of the front surface 412b.

Next, verification tests were conducted on the operation effects described above. Seven power element mounting substrates which are different from one another in at least one of purity of Al, thickness and Fe concentration were formed in the circuit layer material which forms the circuit layer. The ment development area with respect to the area of the joining interface of the ceramic plate and the back surface of the circuit layer, i.e., the detachment development ratio was computed.

Based on the photographed data, the ratio of the crack development area with respect to the cross sectional area of the first solder layer which joins the front surface of the circuit layer and the heat block, i.e., the ratio of crack development area was computed.

Based on the photographed data, the ratio of the crack development area with respect to the cross sectional area of the second solder layer which joins the heat block and the semiconductor chip, i.e., the ratio of crack development area was computed.

The result is shown in Table 7.

TABLE 7

| | Circuit layer material | | | Circuit layer | | | |
|---|---|---|---|---|---|---|---|
| | | | | Al purity after brazing (%) | Back surface side | | |
| | Al Purity (%) | Thickness (mm) | Fe Concentration (wt %) | | Thickness (mm) | Ratio (%) | Fe Concentration (wt %) |
| Example 1E | 99.5 | 0.6 | 0.3 | 99.3 | 0.2 | 33.3 | 0.04 |
| Example 2E | 99.5 | 0.8 | 0.38 | 99.4 | 0.25 | 31.3 | 0.04 |
| Example 3E | 99.4 | 0.6 | 0.45 | 99.4 | 0.18 | 30.0 | 0.06 |
| Example 4E | 99.0 | 0.6 | 0.74 | 98.8 | 0.1 | 16.7 | 0.07 |
| Example 5E | 98.5 | 0.6 | 1.0 | 98.4 | 0.04 | 6.7 | 0.07 |
| Comparative Example 1E | 99.99 | 0.4 | 0.001 | 99.7 | 0.4 | 100.0 | Not detected |
| Comparative Example 2E | 99.99 | 0.6 | 0.001 | 99.8 | 0.6 | 100.0 | Not detected |

| | Circuit layer Front surface side | | | Heat cycle test | | |
|---|---|---|---|---|---|---|
| | Thickness (mm) | Ratio (%) | Fe Concentration (wt %) | Detachment development ratio (%) of circuit layer/ Ceramic plate | Crack development ratio (%) in first solder layer | Crack development ratio (%) in second solder layer |
| Example 1E | 0.4 | 66.7 | 0.3 | <1.0 | 3 | <1.0 |
| Example 2E | 0.55 | 68.8 | 0.3 | <1.0 | 4 | <1.0 |
| Example 3E | 0.42 | 70.0 | 0.4 | <1.0 | 3 | <1.0 |
| Example 4E | 0.5 | 83.3 | 0.6 | <1.0 | 2 | <1.0 |
| Example 5E | 0.56 | 93.3 | 0.9 | 15 | 0 | <1.0 |
| Comparative Example 1E | None | None | — | 0 | 55 | <1.0 |
| Comparative Example 2E | None | None | — | 0 | 49 | <1.0 | circuit layers of the power element mounting substrates were different from one another in at least one of Fe concentration in the side of the back surface on which the ceramic plate was brazed, Fe concentration in the side of the front surface on which the heat block was soldered, thickness of the side of the back surface and thickness of the side of the front surface. Each of semiconductor chips of the same performance was soldered to a surface of the circuit layer of each power element mounting substrate using a Sn—Ag—Cu-containing lead-free solder material. The obtained stacked member was subject to 2000 heat cycles, with one cycle having a temperature history of increasing the temperature from −40° C. to 105° C. in about 3 minutes and then decreasing the temperature from 105° C. to −40° C. in 10 minutes.

Then, each power element mounting substrate was photographed using an ultrasonic imaging device (140 MHz probe). Based on the photographed data, ratio of the detach- It was confirmed that both of the detachment development ratio and the crack development ratio were able to be controlled after 2000 heat cycles and the aforementioned operation effects were achieved under the following conditions: the circuit layer 412 was made of Al alloy with an average purity of more than or equal to 98.0 wt % to less than or equal to 99.9 wt %; the Fe concentration in the side of the front surface 412b to which the heat block 413 is brazed was more than or equal to 0.1 wt %; and Fe concentration in the side of the back surface 412a to which the ceramic plate 411 is brazed was less than 0.1 wt %.

Even if a lead-free solder material is used to solder the circuit layer and a power element, easy development of the crack in the solder layer during the heat cycle can be prevented.

Even if the cooler is brazed directly to the back surface of the ceramic plate, generation of warping during the formation of the power element mounting unit can be prevented. Thus, decrease in reliability on the heat cycle can be avoided.

Reliability on the heat cycle of the power module can be increased without imparting buckling strength of the pending section of the cooler.

Further, joining reliability during the heat cycle of the power module can be increased.

What is claimed is:

1. A power element mounting substrate comprising:
a circuit layer having a back circuit layer surface brazed to a front ceramic plate surface of a ceramic plate, the circuit layer having a front circuit layer surface on which a power element is to be soldered, the front circuit layer surface being opposite to the back circuit layer surface,
wherein the circuit layer is constituted using an Al alloy with an average purity of an Al concentration of more than or equal to 98.0 wt % and less than or equal to 99.9 wt %,
a first Fe concentration of the circuit layer at a back portion being adjacent to the back circuit layer surface is less than 0.1 wt %, and
a second Fe concentration of the circuit layer at a front portion being adjacent to the front circuit layer surface is more than or equal to 0.1 wt %.

2. The power element mounting substrate according to claim 1, wherein the back portion of the circuit layer is defined as a section of more than or equal to 10% to less than or equal to 50% of a thickness of the circuit layer from the back circuit layer surface toward the front circuit layer surface, and a remainder is defined as the front portion of the circuit layer except for the back portion.

3. A power module comprising a power element mounting substrate having a back circuit layer surface of a circuit layer brazed to a front ceramic plate surface of a ceramic plate, and a power element soldered to a front circuit layer surface of the circuit layer, wherein the power element mounting substrate is the power element mounting substrate according to claim 1.

4. A method of manufacturing a power element mounting substrate having a back circuit layer surface of a circuit layer brazed to a front ceramic plate surface of a ceramic plate, the circuit layer having a front circuit layer surface on which a power element is to be soldered, the back circuit layer surface being opposite to the front circuit layer surface, the method comprising:
producing a stacked member by providing, on the front ceramic plate surface, an Al-containing brazing material foil, and a circuit layer material of the circuit layer in this order, the circuit layer material constituted using an Al alloy with a Fe concentration of more than or equal to 0.05 wt % to less than or equal to 1.0 wt % and a purity of an Al concentration of more than or equal to 98.5 wt % to less than or equal to 99.95 wt %; and
producing the power element mounting substrate by heating the stacked member while the stacked member is pressed in a stacking direction to melt the Al-containing brazing material foil, and brazing the circuit layer material to the front ceramic plate surface resulting in the circuit layer material having an average purity of the Al concentration of more than or equal to 98.0 wt % and less than or equal to 99.9 wt %, a first Fe concentration of the circuit layer at a back portion being adjacent to the back circuit layer surface is less than 0.1 wt %, and a second Fe concentration of the circuit layer at a front portion being adjacent to the front circuit layer surface is more than or equal to 0.1 wt %.

5. A power element mounting unit comprising:
a back circuit layer surface of a circuit layer brazed to a front ceramic plate surface of a ceramic plate; and
a cooler having a cooling channel formed therein brazed to a back ceramic plate surface of the ceramic plate, the back ceramic plate surface being opposite to the front ceramic plate surface,
wherein the circuit layer is constituted using an Al alloy with an average purity of an Al concentration of more than or equal to 98.0 wt % and less than or equal to 99.9 wt %,
a first Fe concentration of the circuit layer at a back portion being adjacent to a back circuit layer surface of the circuit layer is less than 0.1 wt %, and
a second Fe concentration of the circuit layer at a front portion being adjacent to a front circuit layer surface of the circuit layer is more than or equal to 0.1 wt %, the front circuit layer surface being opposite to the back circuit layer surface.

6. The power element mounting unit according to claim 5, wherein the back portion of the circuit layer is defined as a section of more than or equal to 10% to less than or equal to 50% of a thickness of the circuit layer from the back circuit layer surface toward the front circuit layer surface, and a remainder is defined as the front portion of the circuit layer except for the back portion.

7. A power module comprising a power element mounting unit having a back circuit layer surface of a circuit layer brazed to a front ceramic plate surface of a ceramic plate, a cooler having a cooling channel formed therein brazed to a back ceramic plate surface of the ceramic plate, and a power element soldered to a front circuit layer surface of the circuit layer, wherein the power element mounting unit is the power element mounting unit according to claim 5.

8. A method of manufacturing a power element mounting unit having a back circuit layer surface of a circuit layer brazed to a front ceramic plate surface of a ceramic plate and a cooler having a cooling channel formed therein brazed to a back ceramic plate surface of the ceramic plate, the back ceramic plate surface being opposite to the front ceramic plate surface, the method comprising:
producing a stacked member by providing, on the front ceramic plate surface, an Al-containing brazing material foil and a circuit layer material of the circuit layer in this order, the circuit layer material constituted using an Al alloy with a Fe concentration of more than or equal to 0.05 wt % to less than or equal to 1.0 wt % and a purity of an Al concentration of more than or equal to 98.5 wt % to less than or equal to 99.95 wt %; and
producing a power element mounting substrate by heating the stacked member while the stacked member is pressed in a stacking direction to melt the Al-containing brazing material foil, and brazing the back circuit layer surface to the front ceramic plate surface resulting in the circuit layer having an average purity of the Al concentration of more than or equal to 98.0 wt % and less than or equal to 99.9 wt %, a first Fe concentration of the circuit layer at a back portion being adjacent to the back circuit layer surface is less than 0.1 wt %, and a second Fe concentration of the circuit layer at a front portion being adjacent to a front circuit layer surface is more than or equal to 0.1 wt %, the front circuit layer surface being opposite to the back circuit layer surface.

9. A power element mounting unit having a back circuit layer surface of a circuit layer brazed to a front ceramic plate surface of a ceramic plate and a cooler having a cooling channel formed therein brazed to a back ceramic plate surface of the ceramic plate, the back ceramic plate surface being opposite to the front ceramic plate surface,
wherein the cooler includes a top plate section which has a front top plate surface to be brazed to the back ceramic plate surface of the ceramic plate and a pending section suspended from a back top plate surface of the top plate section, the back top plate surface being opposite to the front top plate surface, the cooler being constituted using an Al alloy with an average purity of an Al concentration of more than or equal to 98.0 wt % to less than or equal to 99.9 wt %,
a first Fe concentration in a surface section of the top plate section is less than 0.1 wt %, the surface section being adjacent to the front top plate surface, and
a second Fe concentration in the cooler, except for the surface section, is more than or equal to 0.1 wt %.

10. A power module comprising a power element mounting unit having a back circuit layer surface of a circuit layer brazed to a front ceramic plate surface of a ceramic plate, a cooler brazed to a back ceramic plate surface of the ceramic plate, and a power element soldered to a front circuit layer surface of the circuit layer, the front circuit layer surface being opposite to the back circuit layer surface of the circuit layer, wherein the power element mounting unit is the power element mounting unit according to claim 9.

11. A method of manufacturing a power element mounting unit having a back circuit layer surface of a circuit layer brazed to a front ceramic plate surface of a ceramic plate and a cooler brazed to a back ceramic plate surface of the ceramic plate, the back ceramic plate surface being opposite to the front ceramic plate surface, the method comprising:
producing a stacked member by providing a brazing material foil and the cooler on the back ceramic plate surface in this order;
heating the stacked member while the stacked member is pressed in a stacking direction to melt the brazing material foil; and
brazing a front top plate surface of a top plate section of the cooler on the back ceramic plate surface resulting in the cooler having an average purity of an Al concentration of more than or equal to 98.0 wt % to less than or equal to 99.9 wt %, a first Fe concentration in a surface section of the top plate section of the cooler is less than 0.1 wt %, the surface section being adjacent to the front top plate surface, and a second Fe concentration in the cooler, except for the surface section, is more than or equal to 0.1 wt % to provide the power element mounting unit.

12. A power element mounting substrate comprising:
a circuit layer having a front circuit layer surface, the circuit layer having a back circuit layer surface brazed to a front ceramic plate surface of a ceramic plate, the front circuit layer surface being opposite to the back circuit layer surface; and
a heat block constituted using a pure Cu or Cu alloy soldered to the front circuit layer surface, the heat block having a heat block surface on which a power element is to be soldered;
wherein the circuit layer is constituted using an Al alloy with an average purity of an Al concentration of more than or equal to 98.0 wt % and less than or equal to 99.9 wt %,
a first Fe concentration at a back portion being adjacent to the back circuit layer surface is less than 0.1 wt %, and
a second Fe concentration at a front portion being adjacent to the front circuit layer surface is more than or equal to 0.1 wt %.

13. The power element mounting substrate according to claim 12, wherein a thickness of the circuit layer is more than or equal to 0.4 mm, the back portion of the circuit layer is defined as a section of more than or equal to 0.04 mm in thickness from the back circuit layer surface toward the front circuit layer surface, the section being less than or equal to half of the thickness.

14. A power module comprising a power element mounting substrate and a power element, the power element mounting substrate including a circuit layer having a front circuit layer surface and a back circuit layer surface, the back circuit layer surface brazed to a front ceramic plate surface of a ceramic plate, and a heat block, which is constituted using a pure Cu or Cu alloy, is soldered to the front circuit layer surface of the circuit layer, and the power element being soldered to a heat block surface of the heat block, wherein the power element mounting substrate is the power element mounting substrate according to claim 12.

15. A method of manufacturing a power element mounting substrate having a circuit layer with a front circuit layer surface and a back circuit layer surface, the back circuit layer surface being opposite to the front circuit layer surface, the back circuit layer surface being brazed to a front ceramic plate surface of a ceramic plate, and a heat block constituted using a pure Cu or Cu alloy soldered to the front circuit layer surface, the heat block having a heat block surface on which a power element is to be soldered the method comprising:
producing a stacked member by providing, on the front ceramic plate surface, an Al-containing brazing material foil and a circuit layer material of the circuit layer in this order, the circuit layer material constituted using an Al alloy with a Fe concentration of more than or equal to 0.05 wt % to less than or equal to 1.0 wt % and a purity of an Al concentration of more than or equal to 98.5 wt % to less than or equal to 99.95 wt;
heating the stacked member while the stacked member is pressed in a stacking direction to melt the Al-containing brazing material foil, brazing the circuit layer material to the front ceramic plate surface to form the circuit layer and resulting in the circuit layer having an average purity of the Al concentration of more than or equal to 98.0 wt % and less than or equal to 99.9 wt %, a first Fe concentration of the circuit layer at a back portion being adjacent to the back circuit layer surface to be brazed to the front ceramic plate surface is less than 0.1 wt %, and a second Fe concentration of the circuit layer at a front portion being adjacent to the front circuit layer surface is more than or equal to 0.1 wt %; and
soldering the heat block to the front circuit layer surface to provide the power element mounting substrate.

\* \* \* \* \*